(12) United States Patent
Choi

(10) Patent No.: US 12,431,196 B2
(45) Date of Patent: Sep. 30, 2025

(54) SEMICONDUCTOR MEMORY DEVICE AND OPERATING METHOD FOR PERFORMING PROGRAM OPERATION

(71) Applicant: SK hynix Inc., Icheon-si (KR)

(72) Inventor: Eun Hye Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 251 days.

(21) Appl. No.: 17/844,965

(22) Filed: Jun. 21, 2022

(65) Prior Publication Data

US 2023/0298668 A1 Sep. 21, 2023

(30) Foreign Application Priority Data

Jan. 26, 2022 (KR) .................. 10-2022-0011443

(51) Int. Cl.
*G11C 16/04* (2006.01)
*G11C 16/10* (2006.01)
*G11C 16/34* (2006.01)

(52) U.S. Cl.
CPC .......... *G11C 16/10* (2013.01); *G11C 16/0483* (2013.01); *G11C 16/3459* (2013.01)

(58) Field of Classification Search
CPC . G11C 16/10; G11C 16/0483; G11C 16/3459; G11C 11/5628; G11C 16/34; G11C 16/08; G11C 16/26

USPC .................................................... 365/185.28
See application file for complete search history.

(56) References Cited

U.S. PATENT DOCUMENTS 8,539,138 B2 * 9/2013 Kim .................. G11C 16/3454
                                                                   711/103
10,340,012 B2 * 7/2019 Lee ........................ G11C 16/18

FOREIGN PATENT DOCUMENTS

KR          100965076 B1    6/2010
KR       1020170053032 A    5/2017

* cited by examiner

*Primary Examiner* — Tha-O H Bui
(74) *Attorney, Agent, or Firm* — WILLIAM PARK AND ASSOCIATES LTD.

(57) ABSTRACT

A semiconductor memory device includes a memory cell array, a peripheral circuit, and control logic. The memory cell array includes a plurality of memory cells. The peripheral circuit performs a program operation on selected memory cells among the plurality of memory cells. The control logic controls the program operation of the peripheral circuit. The control logic controls the peripheral circuit to perform the program operation on the selected memory cells by using a first program voltage determined based on a first step voltage during a first program period and controls the peripheral circuit to perform the program operation on the selected memory cells by using a second program voltage determined based on a second step voltage different from the first step voltage during a second program period after the first program period.

11 Claims, 20 Drawing Sheets

SEMICONDUCTOR MEMORY DEVICE AND OPERATING METHOD FOR PERFORMING PROGRAM OPERATION

CROSS-REFERENCE TO RELATED APPLICATION

The present application claims priority under 35 U.S.C. § 119(a) to Korean patent application number 10-2022-0011443 filed on Jan. 26, 2022, in the Korean Intellectual Property Office, the entire disclosure of which is incorporated by reference herein.

BACKGROUND

1. Technical Field

The present disclosure generally relates to an electronic device, and more particularly, to a semiconductor memory device and an operating method of the semiconductor memory device.

2. Related Art

A memory device may be formed in a two-dimensional structure in which strings are arranged horizontally to a semiconductor substrate, or be formed in a three-dimensional structure in which strings are arranged vertically to a semiconductor substrate. A three-dimensional memory device is a semiconductor memory device devised to overcome the limit of degree of integration in two-dimensional semiconductor memory devices, and may include a plurality of memory cells vertically stacked above a semiconductor substrate.

SUMMARY

In accordance with an embodiment of the present disclosure, there is provided a semiconductor memory device including: a memory cell array including a plurality of memory cells; a peripheral circuit configured to perform a program operation on selected memory cells among the plurality of memory cells; and control logic configured to control the program operation of the peripheral circuit, wherein the control logic controls the peripheral circuit to perform the program operation on the selected memory cells by using a first program voltage determined based on a first step voltage during a first program period, and controls the peripheral circuit to perform the program operation on the selected memory cells by using a second program voltage determined based on a second step voltage different from the first step voltage during a second program period after the first program period.

In accordance with an embodiment of the present disclosure, there is provided a method of operating a semiconductor memory device, which includes a plurality of program loops, wherein at least some program loops among the plurality of program loops include: determining a step voltage, based on a current program loop number, and determining a program voltage, based on the step voltage; applying the program voltage to selected memory cells; and performing a verify operation on the selected memory cells.

BRIEF DESCRIPTION OF THE DRAWINGS

Examples of embodiments will now be described hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Embodiments provide a semiconductor memory device having an improved program speed and an operating method of the semiconductor memory device.

Figure 1:
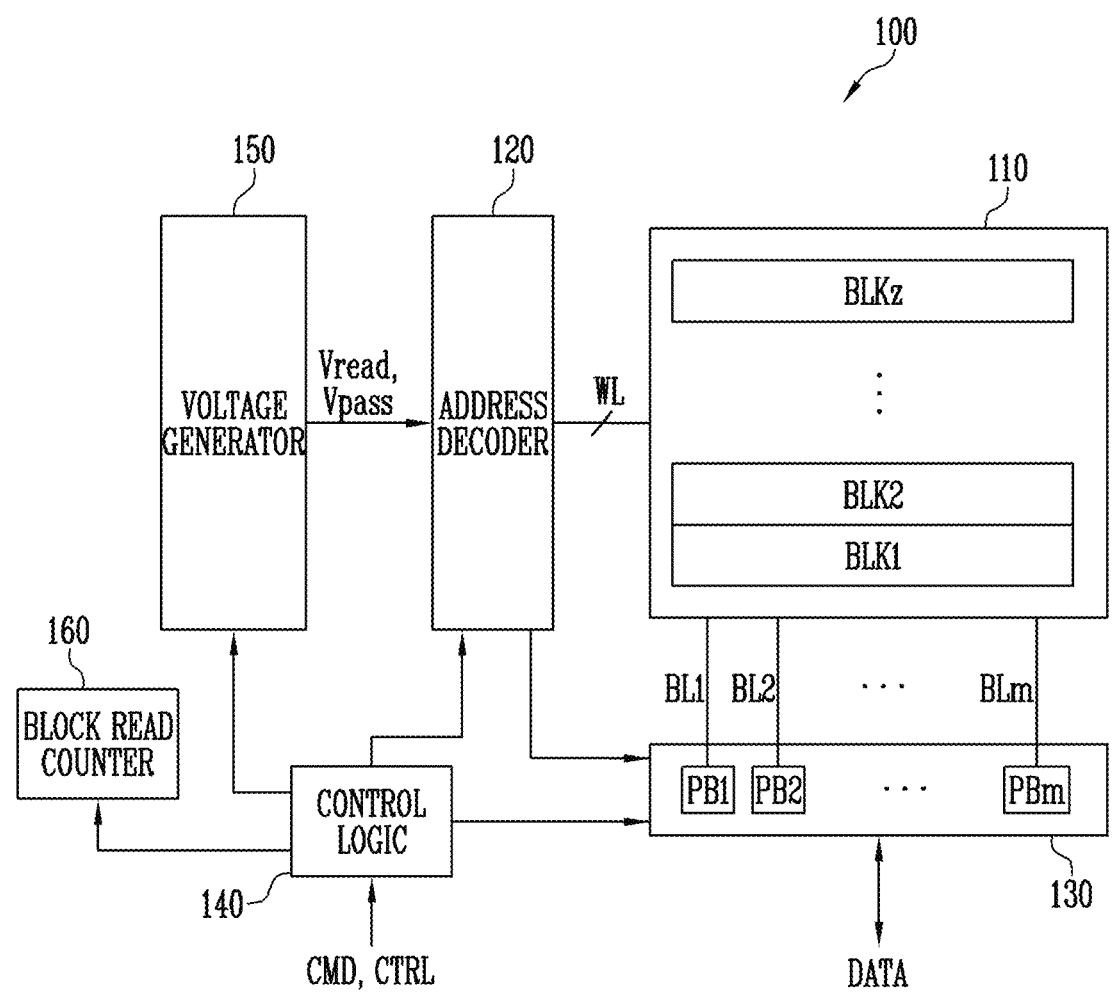
FIG. 1 is a block diagram illustrating a semiconductor memory device in accordance with an embodiment of the present disclosure.

FIG. 1 is a block diagram illustrating a semiconductor memory device in accordance with an embodiment of the present disclosure.

Referring to FIG. 1, the semiconductor memory device 100 may include a memory cell array 110, an address decoder 120, a read/write circuit 130, control logic 140, and a voltage generator 150. The control logic 140 may be implemented as hardware, software, or a combination of hardware and software. For example, the control logic 140 may be a control logic circuit operating in accordance with an algorithm and/or a processor executing control logic code.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read/write circuit 130 through bit lines BL1 to BLm. Each of the plurality of memory blocks BLK1 to BLKz includes a plurality of memory cells. In an embodiment, the plurality of memory cells may be nonvolatile memory cells, and be configured as nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Meanwhile, each of the plurality of memory cells included in the memory cell array 110 may store at least 1-bit data. In an embodiment, each of plurality of the memory cells included in the memory cell array 110 may be a single-level cell (SLC) storing 1-bit data. In another embodiment, each of the plurality of memory cells included in the memory cell array 110 may be a multi-level cell (MLC) storing 2-bit data. In still another embodiment, each of the plurality of memory cells included in the memory cell array 110 may be a triple-level cell (TLC) storing 3-bit data. In still another embodiment, each of the plurality of memory cells included in the memory cell array 110 may be a quadruple-level cell (QLC) storing 4-bit data. In some embodiments, the memory cell array 110 may include a plurality of memory cells each storing 5-or-more bit data.

The address decoder 120, the read/write circuit 130, and the voltage generator 150 operate as a peripheral circuit for driving the memory cell array 110. The address decoder 120 is connected to the memory cell array 110 through the word lines WL. The address decoder 120 operates under the control of the control logic 140. The address decoder 120 receives an address through an input/output buffer (not shown) in the semiconductor memory device 100.

The address decoder 120 decodes a block address in the received address. The address decoder 120 selects at least one memory block according to the decoded block address. Also, in a read voltage application operation during a read operation, the address decoder 120 applies a read voltage Vread generated by the voltage generator 150 to a selected word line of the selected memory block, and applies a pass voltage Vpass generated by the voltage generator 150 to the other unselected word lines. Also, in a program verify operation, the address decoder 120 applies a verify voltage generated by the voltage generator 150 to the selected word line of the selected memory block, and applies the pass voltage Vpass to the other unselected word lines.

The address decoder 120 decodes a column address in the received addresses. The address decoder 120 transmits the decoded column address to the read/write circuit 130.

Read and program operations of the semiconductor memory device 100 are performed in units of pages. An address received in response to a request for the read and program operations includes a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The read/write circuit 130 may operate as a "read circuit" in a read operation, and operate as a "write circuit" in a write operation. The plurality of page buffers PB1 to PBm are connected to the memory cell array 110 through the bit lines BL1 to BLm. In order to sense a threshold voltage of memory cells in a read operation or a program verify operation, the plurality of page buffers PB1 to PBm sense, through a sensing node, a change in amount of current flowing according to a program state of a corresponding memory cell while continuously supplying a sensing current to bit lines connected to the memory cells, and latch the sensed change in amount of current as sensing data. The read/write circuit 130 operates in response to page buffer control signals output from the control logic 140.

In a read operation, the read/write circuit 130 temporarily stores read data by sensing data of a memory cell and then outputs data DATA to the input/output buffer (not shown) of the semiconductor memory device 100. In an embodiment, for example, the read/write circuit 130 may include a column select circuit and the like in addition to the page buffers (or page registers).

The control logic 140 is connected to the address decoder 120, the read/write circuit 130, and the voltage generator 150. The control logic 140 receives a command CMD and a control signal CTRL though the input/output buffer (not shown) of the semiconductor memory device 100. The control logic 140 controls a general operation of the semiconductor memory device 100 in response to the control signal CTRL. Also, the control logic 140 outputs a control signal for adjusting a sensing node precharge potential level of the plurality of page buffers PB1 to PBm. The control logic 140 may control the read/write circuit 130 to perform a read operation of the memory cell array 110.

According to the semiconductor memory device and an operating method of the semiconductor memory device in accordance with various embodiments of the present disclosure, since a program voltage applied to a bit line is adjusted according to a position of a memory cells, a difference between program speeds of memory cells can be narrowed, and accordingly, the program speed of the semiconductor memory device 100 can be improved. The adjusting of the program voltage applied to the bit line according to the semiconductor memory device and the operating method of the semiconductor memory device in accordance with embodiments of the present disclosure will be described in later with reference to FIGS. 6 to 16.

The voltage generator 150 generates a read voltage Vread and a pass voltage Vpass in a read operation in response to a control signal output from the control logic 140. In order to generate a plurality of voltages having various voltage levels, the voltage generator 150 may include a plurality of pumping capacitors for receiving an internal power voltage, and generate the plurality of voltages by selectively activating the plurality of pumping capacitors under the control of the control logic 140.

Figure 2:
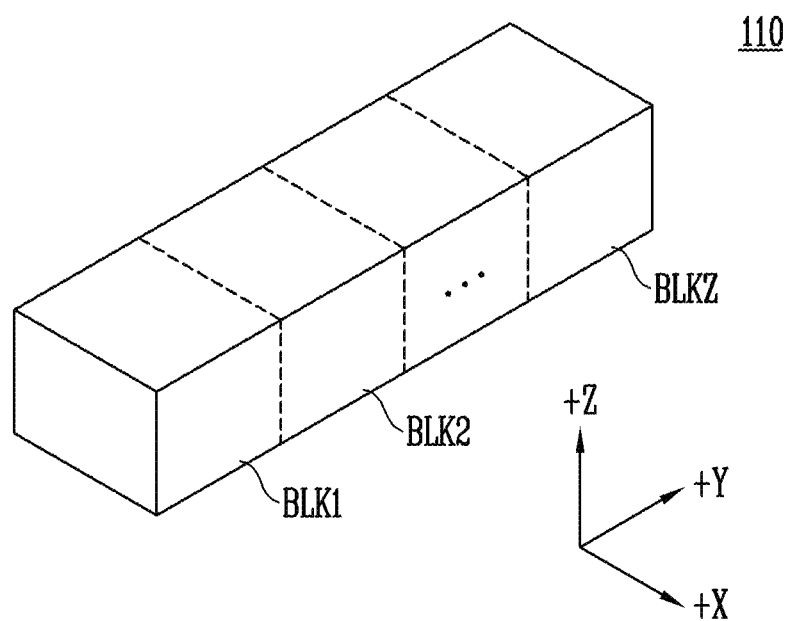
FIG. 2 is a diagram illustrating an embodiment of a memory cell array shown in FIG. 1.

FIG. 2 is a diagram illustrating an embodiment of a memory cell array shown in FIG. 1.

Referring to FIG. 2, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 3 and 4.

Figure 3:
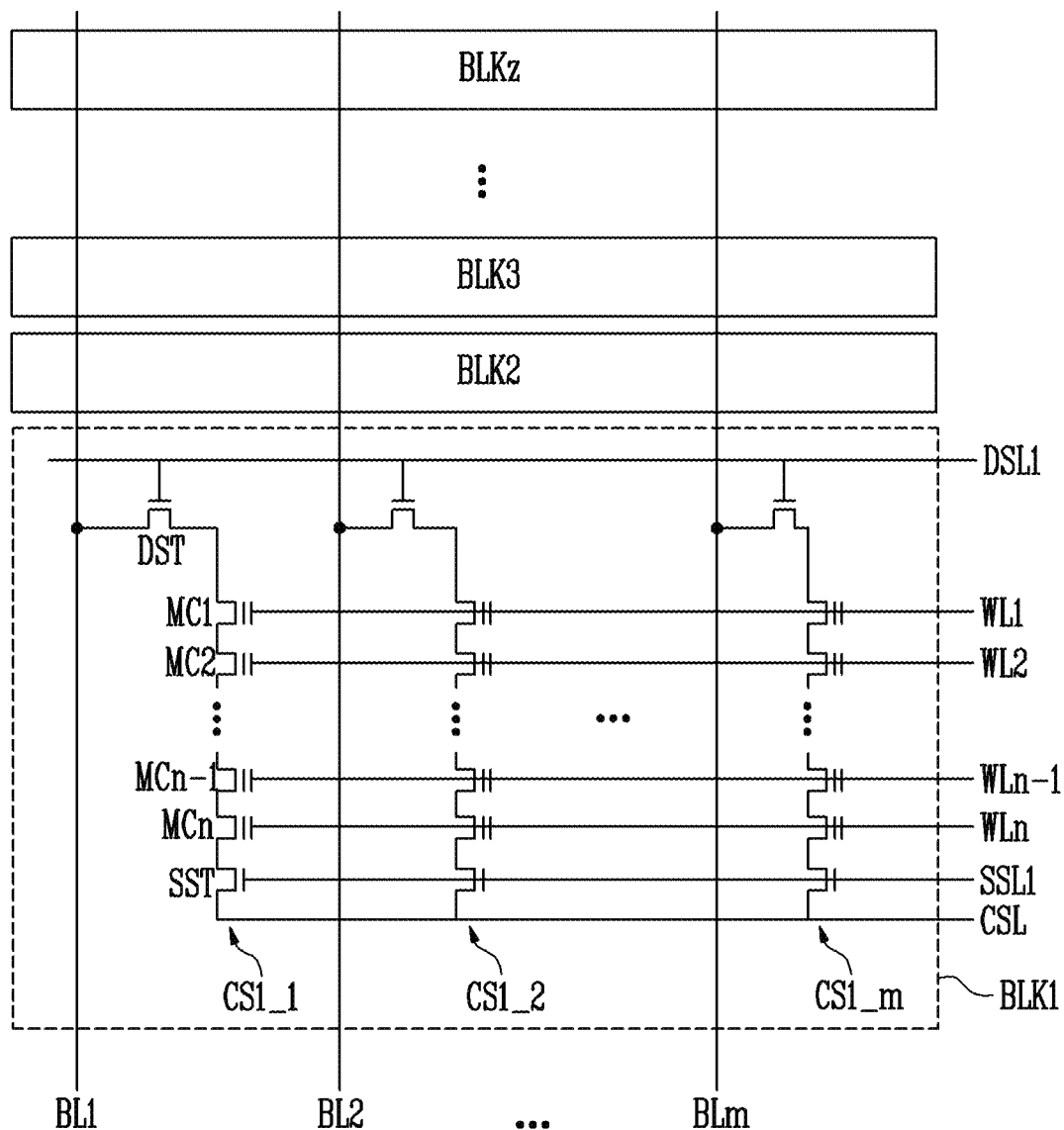
FIG. 3 is a diagram illustrating another embodiment of the memory cell array shown in FIG. 1.

FIG. 3 is a diagram illustrating another embodiment of the memory cell array shown in FIG. 1.

Referring to FIG. 3, first to zth memory blocks BLK1 to BLKz included in a memory cell array 110_1 are commonly connected to the first to mth bit lines BL1 to BLm. In FIG. 3, for convenience of description, components included in the first memory block BLK1 among the plurality of memory blocks BLK1 to BLKz are illustrated, and components included in each of the other memory blocks BLK2 to BLKz are omitted. It will be understood that each of the other memory blocks BLK2 to BLKz is configured identically to the first memory block BLK1.

The first memory block BLK1 may include a plurality of cell strings CS1_1 to CS1_$m$. First to mth cell strings CS1_1 to CS1_$m$ are respectively connected to the first to mth bit lines BL1 to BLm.

Each of the first to mth cell strings CS1_1 to CS1_$m$ includes a drain select transistor DST, a plurality of memory cells MC1 to MCn connected in series, and a source select transistor SST. The drain select transistor DST is connected to a drain select line DSL1. First to nth memory cells MC1 to MCn are respectively connected to first to nth word lines WL1 to WLn. The source select transistor SST is connected to a source select line SSL1. A drain side of the drain select transistor DST is connected to a corresponding bit line. Drain select transistors of the first to mth cell strings CS1_1 to CS1_$m$ are respectively connected to the first to mth bit lines BL1 to BLm. A source side of the source select transistor SST is connected to a common source line CSL. In an embodiment, the common source line CSL may be commonly connected to the first to zth memory blocks BLK1 to BLKz.

The drain select line DSL1, the first to nth word lines WL1 to WLn, and the source select line SSL1 is controlled by the address decoder 120. The common source line CSL may be controlled by the control logic 140. The first to mth bit lines BL1 to BLm are controlled by the read/write circuit 130.

As shown in FIG. 3, the memory cell array 110 of the semiconductor memory device 100 in accordance with the embodiment of the present disclosure may be configured as the memory cell array 110_1 having a two-dimensional structure. However, in some embodiments, the memory cell array 110 of the semiconductor memory device 100 may be configured as a memory cell array having a three-dimensional structure. A memory cell array having a three-dimensional structure will be described later with reference to FIGS. 4 and 5.

Figure 4:
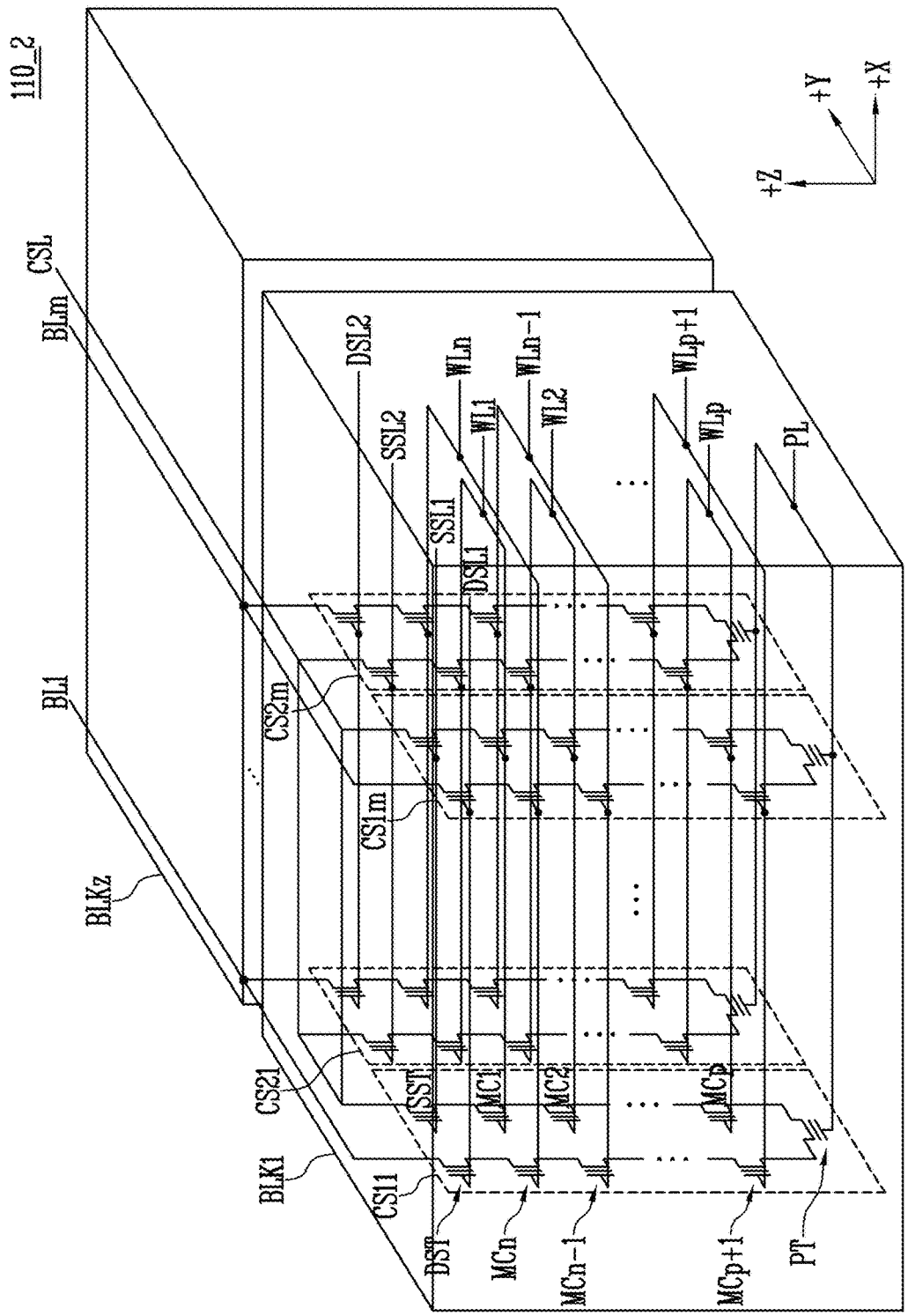
FIG. 4 is a diagram illustrating still another embodiment of the memory cell array shown in FIG. 1.

FIG. 4 is a diagram illustrating still another embodiment 110_2 of the memory cell array 110 shown in FIG. 1.

Referring to FIG. 4, a memory cell array 110_2 includes a plurality of memory blocks BLK1 to BLKz. In FIG. 4, for convenience of description, an internal configuration of a first memory block BLK1 is illustrated, and internal configurations of the other memory blocks BLK2 to BLKz are omitted. It will be understood that second to zth memory blocks BLK2 to BLKz are configured similarly to the first memory block BLK1.

Referring to FIG. 4, the first memory block BLK1 may include a plurality of cell strings CS11 to CS1$m$ and CS21 to CS2$m$. In an embodiment, each of the plurality of cell strings CS11 to CS1$m$ and CS21 to CS2$m$ may be formed in a 'U' shape. In the first memory block BLK1, m cell strings are arranged in a row direction (i.e., the +X direction). Although a case two cell strings arranged in a column direction (i.e., the +Y direction) is illustrated in FIG. 4, this is for convenience of description, and it will be understood that three cell strings may be arranged in the column direction.

Each of the plurality of cell strings CS11 to CS1$m$ and CS21 to CS2$m$ may include at least one source select transistor SST, first to nth memory cells MC1 to MCn, a pipe transistor PT, and at least one drain select transistor DST.

The select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp.

In an embodiment, the source select transistors of cell strings arranged on the same row are connected to a source select line extending in the row direction, and the source select transistors of cell strings arranged on different rows are connected to different source select lines. In FIG. 4, the source select transistors of the cell strings CS11 to CS1$m$ on a first row are connected to a first source select line SSL1. The source select transistors of the cell strings CS21 to CS2$m$ on a second row are connected to a second source select line SSL2.

In another embodiment, the source select transistors of the cell strings CS11 to CS1$m$ and CS21 to CS2$m$ may be commonly connected to one source select line.

The first to nth memory cells MC1 to MCn of each cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of the +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. Cell strings arranged in the row direction are connected to a drain select line extending in the row direction. The drain select transistors of the cell strings CS11 to CS1m on the first row are connected to a first drain select line DSL1. The drain select transistors of the cell strings CS21 to CS2m on the second row are connected to a second drain select line DSL2.

Cell strings arranged in the column direction are connected to a bit line extending in the column direction. In FIG. 4, the cell strings CS11 and CS21 on a first column are connected to a first bit line BL1. The cell strings CS1m and CS2m on an mth column are connected to an mth bit line BLm.

Memory cells connected to the same word line in the cell strings arranged in the row direction constitute one page. For example, memory cells connected to the first word line WL1 in the cell strings CS11 to CS1m on the first row constitute one page. Memory cells connected to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

Figure 5:
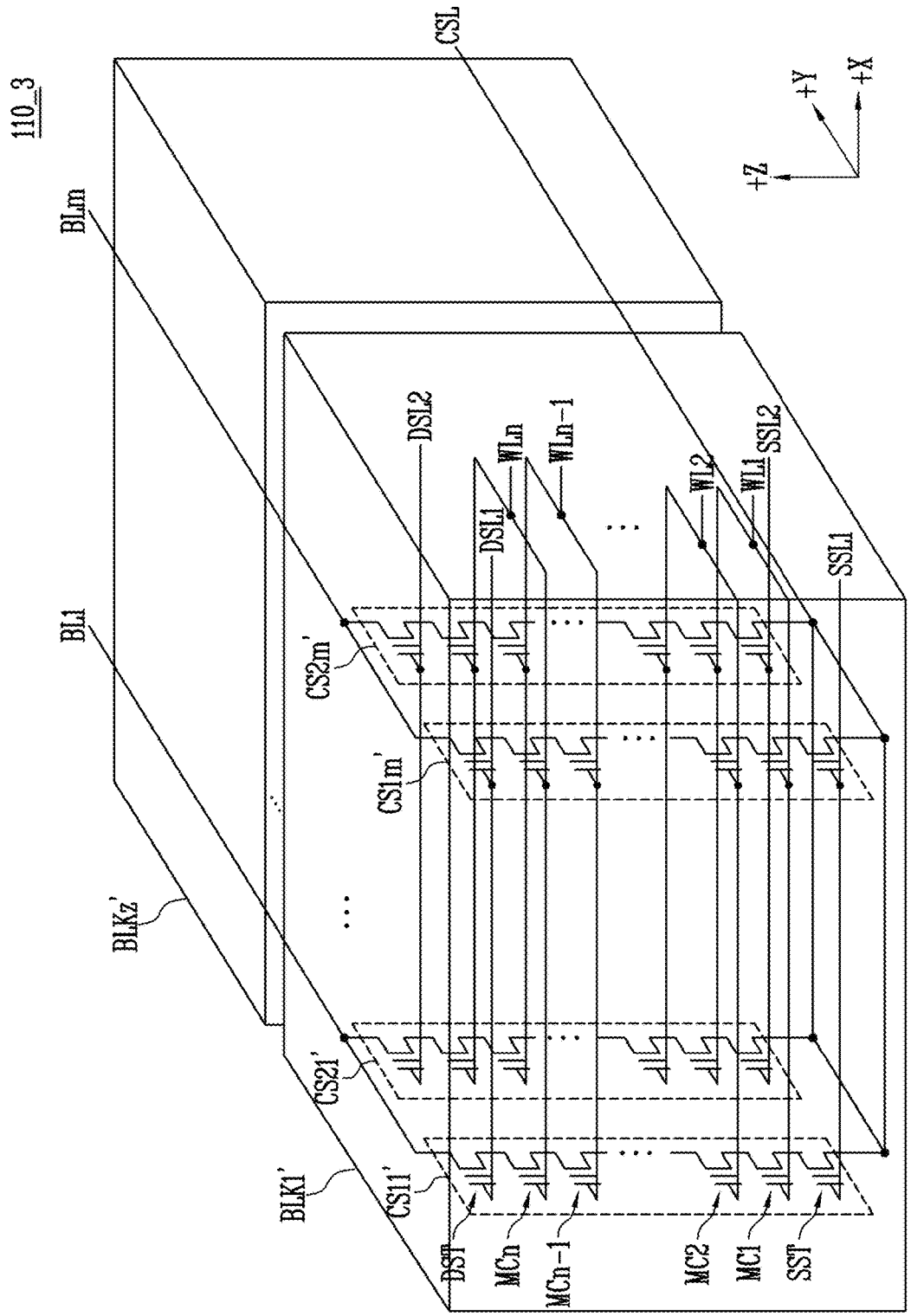
FIG. 5 is a diagram illustrating still another embodiment of the memory cell array shown in FIG. 1.

FIG. 5 is a diagram illustrating still another embodiment 110_3 of the memory cell array 110 shown in FIG. 1.

Referring to FIG. 5, a memory cell array 110_3 includes a plurality of memory blocks BLK1' to BLKz'. In FIG. 4, for convenience of description, an internal configuration of a first memory block BLK1' is illustrated, and internal configurations of the other memory blocks BLK2' to BLKz' are omitted. It will be understood that second to zth memory blocks BLK2' to BLKz' are configured similarly to the first memory block BLK1'.

The first memory block BLK1' may include a plurality of cell strings CS11' to CS1m' and CS21' to CS2m'. Each of the plurality of cell strings CS11' to CS1m' and CS21' to CS2m' extends in the +Z direction. In the first memory block BLK1', m cell strings are arranged in the +X direction. Although a case two cell strings arranged in the +Y direction is illustrated in FIG. 5, this is for convenience of description, and it will be understood that three cell strings may be arranged in the column direction.

Each of the plurality of cell strings CS11' to CS1m' and CS21' to CS2m' includes at least one source select transistor SST, first to nth memory cells MC1 to MCn, and at least one drain select transistor DST.

The source select transistor SST of each cell string is connected between a common source line CSL and the memory cells MC1 to MCn. The source select transistors of cell strings arranged on the same row are connected to the same source select line. The source select transistors of the cell strings CS11' to CS1m' arranged on a first row are connected to a first source select line SSL1. Source select transistors of the cell strings CS21' to CS2m' arranged on a second row are connected to a second source select line SSL2. In another embodiment, the source select transistors of the cell strings CS11' to CS1m' and CS21' to CS2m' may be commonly connected to one source select line.

The first to nth memory cells MC1 to MCn of each cell string are connected in series between the source select transistor SST and the drain select transistor DST. Gate electrodes of the first to nth memory cells MC1 to MCn are connected to first to nth word lines WL1 to WLn, respectively.

The drain select transistor DST of each cell string is connected between a corresponding bit line and the memory cells MC1 to MCn. The drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

Consequently, the memory block BLK1' shown in FIG. 5 has a circuit similar to the circuit of the memory block BLK1 shown FIG. 4, except that the pipe transistor PT is excluded from each cell string shown in FIG. 5.

Figure 6:
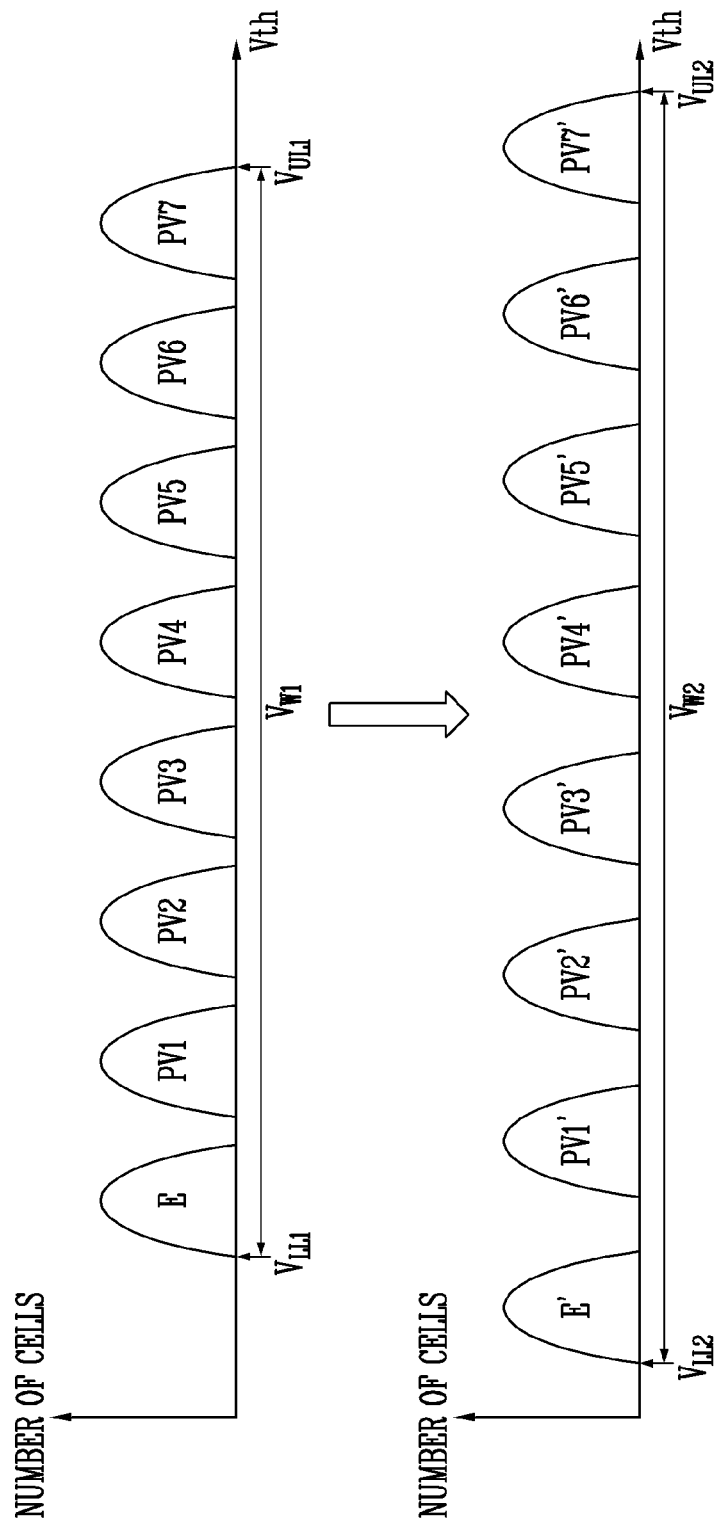
FIG. 6 is a graph illustrating a threshold voltage distribution of memory cells when a threshold voltage window is widened to improve a read margin.

FIG. 6 is a graph illustrating a threshold voltage distribution of memory cells when a threshold voltage window is widened to, for example, improve a read margin.

Referring to FIG. 6, a threshold voltage distribution of memory cells included in a first window $V_{w1}$ and a threshold voltage distribution of memory cells included in a second window $V_{w2}$ are illustrated. More specifically, an upper graph shown in FIG. 6 illustrates the threshold voltage distribution of the memory cells included in the first window $V_{w1}$. Referring to the upper graph shown in FIG. 6, the first window $V_{w1}$ has a range between a first lower limit voltage $V_{LL1}$ and a first upper limit voltage $V_{UL1}$. Threshold voltages of memory cells are distributed in the voltage range of the first window $V_{w1}$. In FIG. 6, threshold voltages of triple-level cells (TCLs) corresponding to an erase state E and first to seventh program states PV1 to PV7 are distributed in the first window $V_{w1}$. However, this is merely illustrative, and a first window corresponding to a threshold voltage distribution of single-level cells (SLCs), multi-level cells (MLCs), quad-level cells (QLCs), or the like may also be considered.

As a manufacturing process of memory cells is refined, and the number of bits stored in each memory cell increases, it is important, in an embodiment, to secure a read margin to improve the reliability of the semiconductor memory device 100. The read margin may mean an interval between the erase state E and the first to seventh program states PV1 to PV7. In order to secure the read margin, a window corresponding to a range in which threshold voltages of memory cells are distributed may be extended.

A lower graph shown in FIG. 6 illustrates the threshold voltage distribution of the memory cells included in the second window $V_{w2}$. Referring to the lower graph shown in FIG. 6, the second window $V_{w2}$ having a range wider than the range of the first window $V_{w1}$ is illustrated. The second window $V_{w2}$ has a range between a second lower limit voltage $V_{LL2}$ and a second upper limit voltage $V_{UL2}$. In an embodiment, the second lower limit voltage $V_{LL2}$ may be lower than the first lower limit voltage $V_{LL1}$. Also, in an embodiment, the second upper limit voltage $V_{UL2}$ may be higher than the first upper limit voltage $V_{UL1}$. Referring to the lower graph shown in FIG. 6, threshold voltages of memory cells are distributed in the voltage range of the second window $V_{w2}$. That is, threshold voltages of triple-level cells (TLCs) corresponding to an erase state E' and first to seventh program states PV1' to PV7' are distributed in the second window $V_{w2}$.

As shown in FIG. 6, when the threshold voltage distribution range of memory cells is extended from the first window $V_{w1}$ to the second window $V_{w2}$, an interval between the erase state E' and the first to seventh program states PV1' to PV7' increases. Thus, in an embodiment, the read margin increases, and the reliability of the semiconductor memory device is improved.

Figure 7:
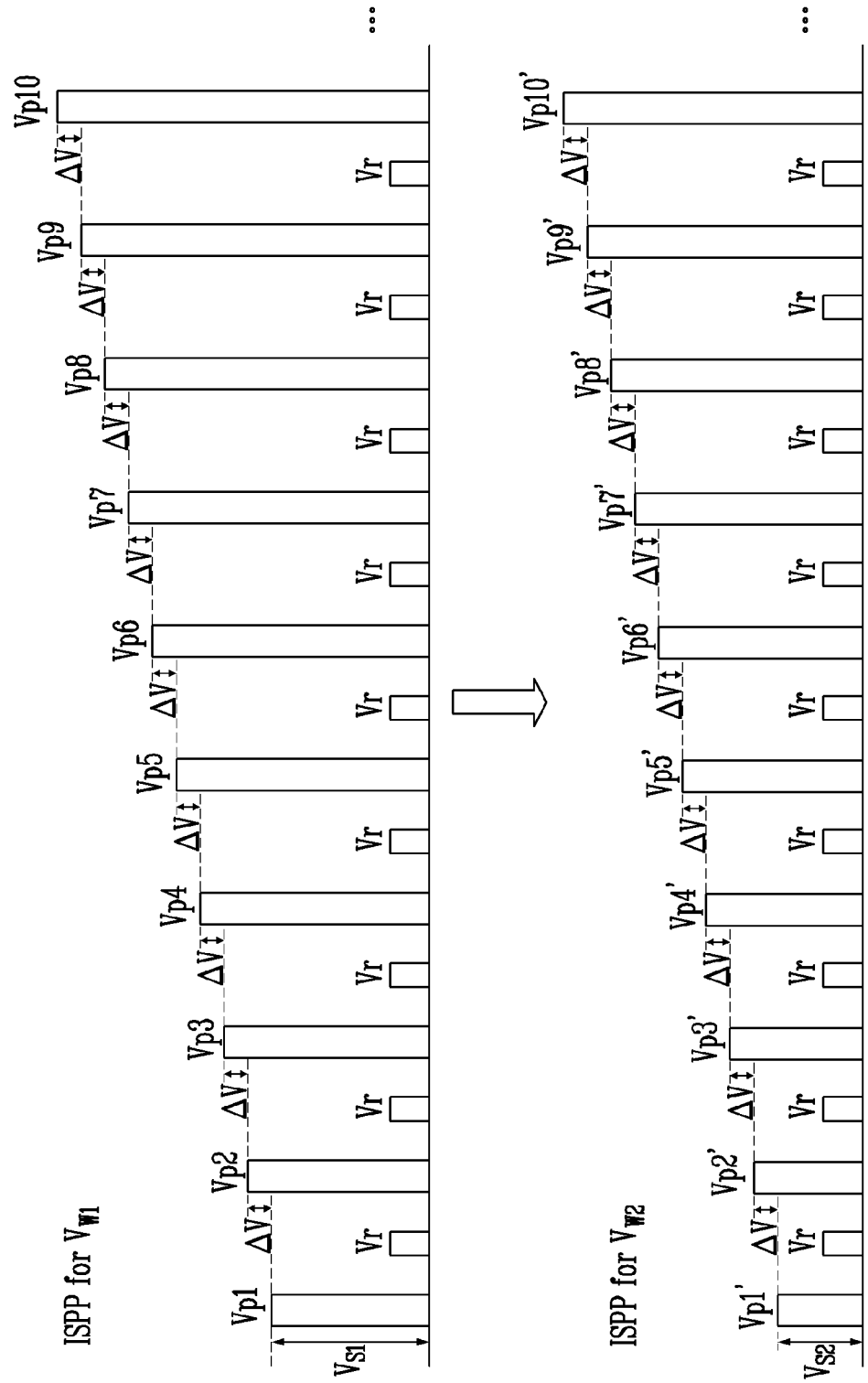
FIG. 7 is a graph illustrating change in program voltage of each program loop in incremental step pulse programming when a threshold voltage window is widened as described with reference to FIG. 6.

FIG. 7 is a graph illustrating change in program voltage of each program loop in incremental step pulse programming when a threshold voltage window is widened as described with reference to FIG. 6.

Referring to an upper graph shown in FIG. 7, program and verify voltages applied to selected memory cells in Incremental Step Pulse Programming (ISPP) corresponding to the first window $V_{w1}$ are illustrated. A program operation using the ISPP includes a plurality of program loops, and each program loop includes a program phase and a verify phase. The program phase is a phase in which a program voltage is applied to a word line connected to selected memory cells. A program pass voltage is applied to unselected word lines. Through the program phase, a threshold voltage of at least some of the memory cells may increase. The verify phase is a phase in which a verify voltage is applied to the word line connected to the selected memory cells. A verify pass voltage is applied to the unselected word lines. Through the verify phase, it is determined whether a threshold voltage of at least some of the selected memory cells is higher than the verify voltage.

Referring to the upper graph shown in FIG. 7, a first program voltage Vp1 is applied to a word line connected to selected memory cells, i.e., a selected word line in a program phase of a first program loop. A magnitude of the first program voltage Vp1 corresponds to a program start voltage $V_{s1}$. After the first program voltage Vp1 is applied to the selected word line, a verify voltage Vr is applied to the selected memory cells in a verify phase of the first program loop.

Subsequently, in a program phase of a second program loop, a second program voltage Vp2 is applied to the selected word line. A magnitude of the second program voltage Vp2 becomes a value higher by a step voltage ΔV than the first program voltage Vp1. After the second program voltage Vp2 is applied to the selected word line, a verify voltage Vr is applied to the selected memory cells in a verify phase of the second program loop.

Subsequently, in a program phase of a third program loop, a third program voltage Vp3 is applied to the selected word line. A magnitude of the third program voltage Vp3 becomes a value higher by the step voltage ΔV than the second program voltage Vp2. After the third program voltage Vp3 is applied to the selected word line, a verify voltage Vr is applied to the selected memory cells in a verify phase of the third program loop.

In this manner, program loops may be repeated until the selected memory cells are completely programmed. In FIG. 7, only 10 program loops are illustrated for an example. Meanwhile, although a case where the verify voltages Vr applied to the selected word line in the verify phases all have the same magnitude is illustrated in FIG. 7, this is merely illustrative. Verify voltages having different magnitudes and different numbers may be applied to the selected word line according to program loops.

Now, referring to a lower graph shown in FIG. 7, program and verify voltages applied to selected memory cells in Incremental Step Pulse Programming (ISPP) corresponding to the second window $V_{w2}$ are illustrated. Referring to the lower graph shown in FIG. 7, a first program voltage Vp1' is applied to a word line connected to selected memory cells, i.e., a selected word line in a program phase of a first program loop. A magnitude of the first program voltage Vp1' corresponds to a program start voltage $V_{s2}$. After the first program voltage Vp1' is applied to the selected word line, a verify voltage Vr is applied to the selected memory cells in a verify phase of the first program loop.

Subsequently, in a program phase of a second program loop, a second program voltage Vp2' is applied to the selected word line. A magnitude of the second program voltage Vp2' becomes a value higher by a step voltage ΔV than the first program voltage Vp1'. After the second program voltage Vp2' is applied to the selected word line, a verify voltage Vr is applied to the selected memory cells in a verify phase of the second program loop.

Subsequently, in a program phase of a third program loop, a third program voltage Vp3' is applied to the selected word line. A magnitude of the third program voltage Vp3' becomes a value higher by the step voltage ΔV than the second program voltage Vp2'. After the third program voltage Vp3' is applied to the selected word line, a verify voltage Vr is applied to the selected memory cells in a verify phase of the third program loop.

Referring to FIG. 6, since the second lower limit voltage $V_{LL2}$ corresponding to the second window $V_{w2}$ is lower than the first lower limit voltage $V_{LL1}$ corresponding to the first window $V_{w1}$, the program start voltage $V_{s2}$ corresponding to the second window $V_{w2}$ may also be lower than the program start voltage $V_{s1}$ corresponding to the first window $V_{w1}$. Accordingly, in the ISPP corresponding to the second window $V_{w2}$, magnitudes of some program voltages (e.g., Vp1' to Vp7') in an initial phase may be lower than the program start voltage $V_{s1}$ of the ISPP corresponding to the first window $V_{w1}$. That is, in an embodiment, when a window of a threshold voltage distribution is widened to improve a read margin, an initial program voltage of the ISPP belongs to a relatively low range as the program start voltage decreases. A program voltage in a relatively low range relatively low increases a threshold voltage of memory cells. As a result, in an embodiment, the number of program loops performed for the purpose of program completion increases, which results in a whole decrease in program speed. Hereinafter, this will be described in detail with reference to FIG. 8.

Figure 8:
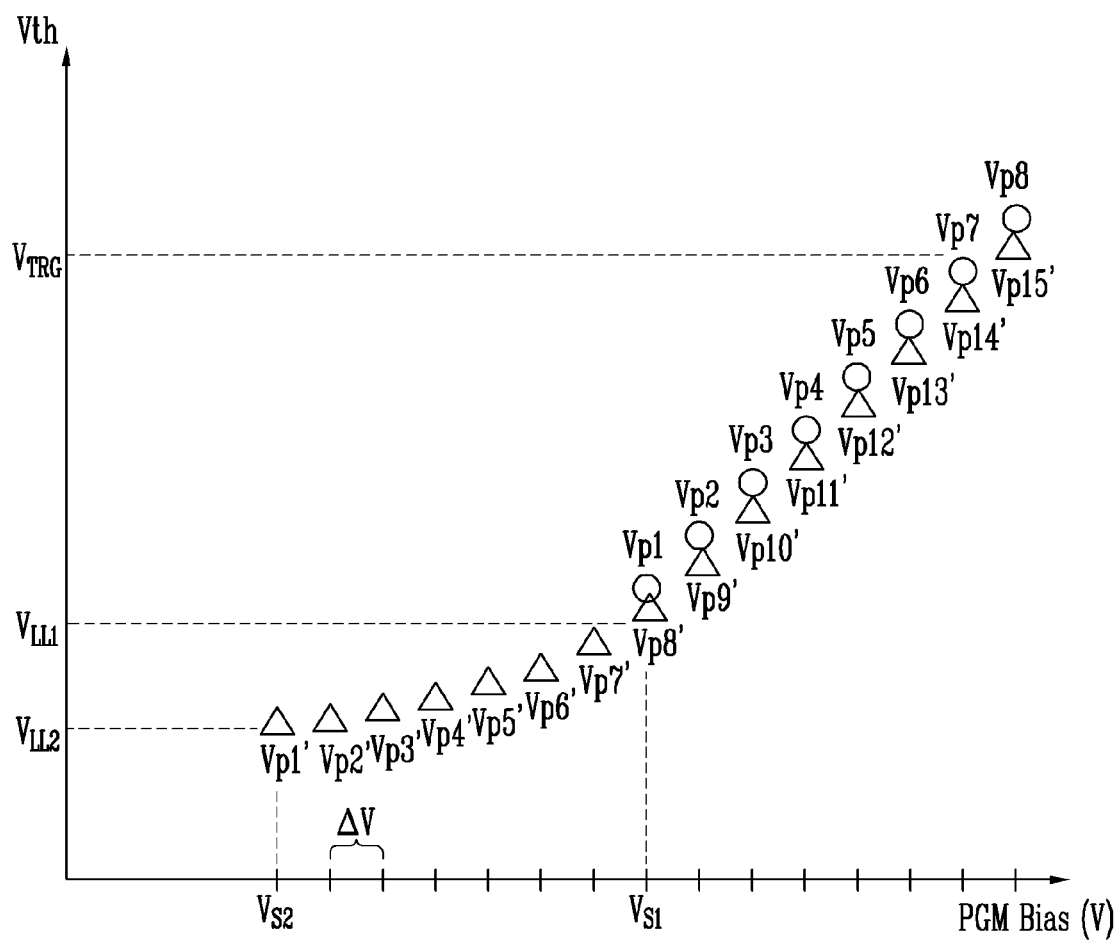
FIG. 8 is a graph illustrating a phenomenon in which a program speed is decreased when initial program voltages decreases as described with reference to FIG. 7.

FIG. 8 is a graph illustrating a phenomenon in which a program speed is decreased when initial program voltages (i.e., program start voltage) decrease as described with reference to FIG. 7.

The horizontal axis of the graph shown in FIG. 8 represents magnitude of program voltage applied in each program loop, i.e., program bias, and the vertical axis of the graph shown in FIG. 8 represents threshold voltage Vth of a memory cells according to application of each program voltage. In FIG. 8, a change in threshold voltage of the memory cell with respect to the program voltage is indicated by a circular shape in the ISSP method corresponding to the first window $V_{w1}$, and a change in threshold voltage of the memory cell with respect to the program voltage is indicated by a triangular shape in the ISSP method corresponding to the second window $V_{w2}$.

As described with reference to FIG. 7, the first program voltage Vp1 has a voltage value corresponding to the program start voltage $V_{s1}$ in the ISSP method corresponding to the first window $V_{w1}$. The second program voltage Vp2 has a voltage value higher by the step voltage ΔV than the first program voltage Vp1. The third program voltage Vp3 also has a voltage value higher by the step voltage ΔV than the second program voltage Vp2. In order to clarify this, an interval of scales indicated on the horizontal axis shown in FIG. 8 corresponds to a voltage value of the step voltage ΔV.

Referring to only circular symbols shown in FIG. 8, change in threshold voltage of the memory cell during first to eighth program loops in the ISSP method corresponding to the first window $V_{w1}$ is illustrated. A threshold voltage of the memory cell in an initial phase has a value in the vicinity of the first lower limit voltage $V_{LL1}$. The threshold voltage of the memory cells will increase as a value slightly higher than the first lower limit voltage $V_{LL1}$ as the first program voltage Vp1 is applied to the memory cell.

As shown in FIG. 8, since the first program voltage Vp1 corresponds to the program start voltage $V_{s1}$ which is relatively high in the ISSP method corresponding to the first window $V_{w1}$, a width with which the threshold voltage of the memory cell is moved is relatively wide when the program voltage is increases by the step voltage ΔV. That is, since a width with the threshold voltage of the memory cell is relatively increased for each program loop, the threshold voltage of the memory cell may reach a target voltage $V_{TRG}$ through only a smaller number of program loops. In FIG. 8, it is illustrated that the threshold voltage of the memory cell reaches the target voltage $V_{TRG}$ through 8 program loops in the ISSP method corresponding to the first window $V_{w1}$.

Meanwhile, referring to only triangular symbols shown in FIG. 8, change in threshold voltage of the memory cells during first to fifteenth program loops in the ISSP method corresponding to the second window $V_{w2}$ is illustrated. A threshold voltage of the memory cell in an initial phase has a value in the vicinity of the second lower limit voltage $V_{LL2}$. The threshold voltage of the memory cells will increase as a value slightly higher than the second lower limit voltage $V_{LL2}$ as the first program voltage Vp1' is applied to the memory cell.

As shown in FIG. 8, since the first program voltage Vp1' corresponds to the program start voltage $V_{s2}$ which is relatively low in the ISSP method corresponding to the second window $V_{w2}$, program voltages applied in some initial program loops may be lower than the program start voltage $V_{s1}$ corresponding to the first window $V_{w1}$. In FIG. 8, it is illustrated that first to seventh program voltages VP1' to Vp7' corresponding to the second window $V_{w2}$ are smaller than the program start voltage $V_{s1}$ corresponding to the first window $V_{w1}$.

When a program voltage corresponding to a voltage interval $V_{s2}$ to Vs is applied to memory cells, the width with which the threshold voltage of the memory cell is moved is relatively narrow. That is, program voltages (e.g., Vp1' to Vp7') applied in some initial program loop are smaller than the program start voltage $V_{s1}$ corresponding to the first window $V_{w1}$ in the ISSP method corresponding to the second window $V_{w2}$, the width with which the threshold voltage of the memory cell is moved is narrow in program voltage application. However, a program pulse applied after an eighth program loop is higher than the program start voltage $V_{s1}$ corresponding to the first window $V_{w1}$, and therefore, the width with which the threshold voltage of the memory cell is moved may be relatively wide.

Accordingly, since a threshold voltage increment of memory cells is remarkably small in an initial program loop, the threshold voltage of the memory cell may reach the target voltage $V_{TRG}$ after a relatively large number of program loops are performed. In FIG. 8, it is illustrated that the threshold voltage of the memory cell reaches the target voltage $V_{TRG}$ through 15 program loops in the ISSP method corresponding to the second window $V_{w2}$. This indicates that a number of program loops in the ISSP method corresponding to the first window $V_{w1}$ is greater by 7 times than a number of program loops in the ISSP method corresponding to the second window $V_{w2}$. Consequently, when the ISSP method corresponding to the first window $V_{w1}$ is applied, as it is, to the second window $V_{w2}$ as a range wider than the first window $V_{w1}$, the program speed can be remarkably decreased.

According to the semiconductor memory device and the operating method thereof in accordance with the embodiment of the present disclosure, in the ISSP method corresponding to the second window $V_{w2}$ including a relatively wide voltage range, a relatively high step voltage is applied in initial program loops, and a relatively low step voltage is applied in subsequent program loops. Accordingly, in an embodiment, a read margin of memory cells can be improved without largely decreasing the program speed even in the ISSP method corresponding to the second window $V_{w2}$ including a relatively wide voltage range.

Figure 9:
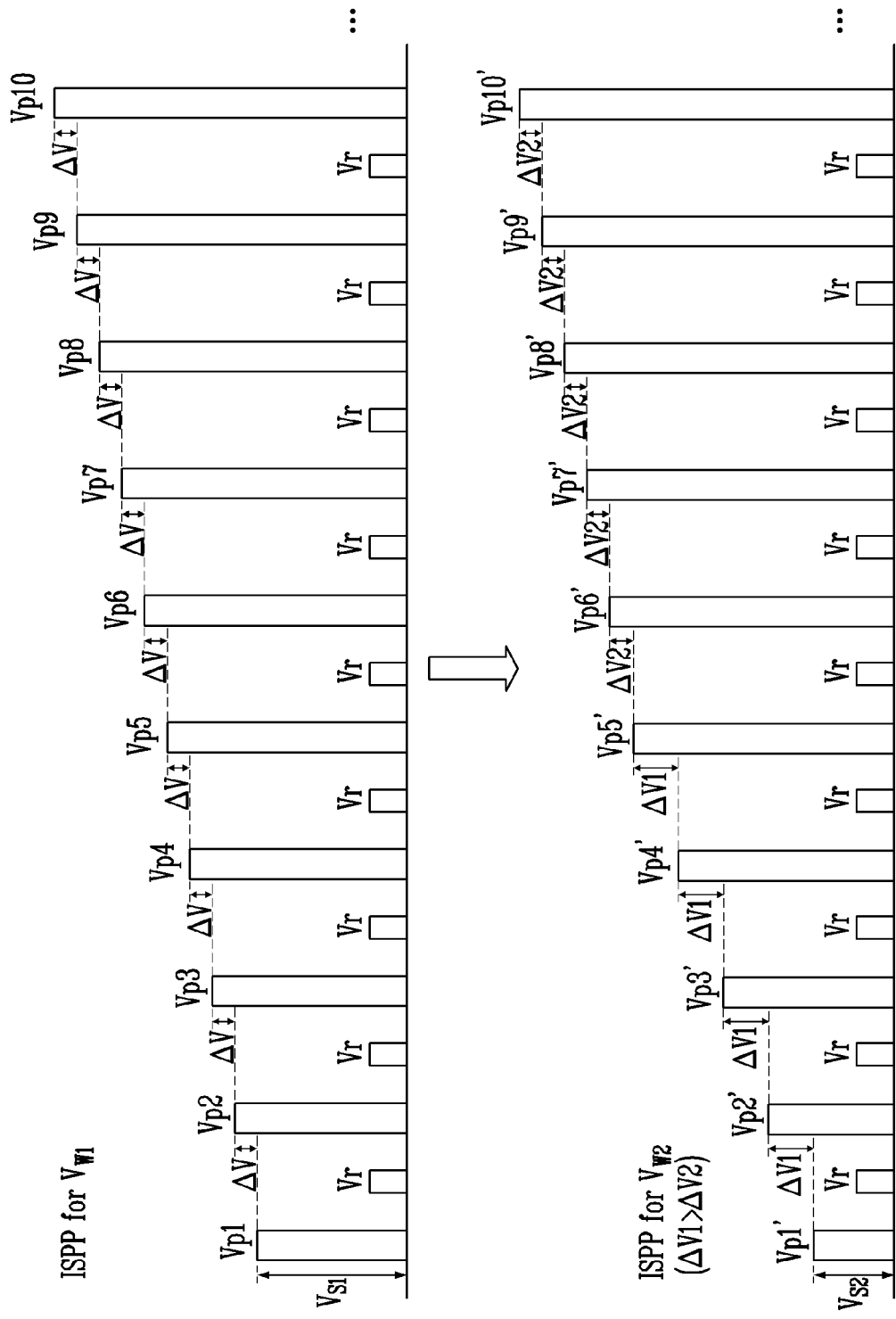
FIG. 9 is a graph illustrating an operating method of the semiconductor memory device in accordance with an embodiment of the present disclosure.

FIG. 9 is a graph illustrating an operating method of the semiconductor memory device in accordance with an embodiment of the present disclosure.

Referring to an upper graph shown in FIG. 9, program and verify voltages applied to selected memory cells in Incremental Step Pulse Programming (ISPP) corresponding to the first window $V_{w1}$ are illustrated. The upper graph shown in FIG. 9 is substantially identical to the upper graph shown in FIG. 7. Therefore, overlapping descriptions will be omitted.

Referring to a lower graph shown in FIG. 9, an embodiment is illustrated, in which the ISSP corresponding to the second window $V_{w2}$ is performed by the operating method of the semiconductor memory device in accordance with the present disclosure. Referring to the lower graph shown in FIG. 9, a first program voltage Vp1' is applied to a word line connected to selected memory cells, i.e., a selected word line in a program phase of a first program loop. A magnitude of the first program voltage Vp1' corresponds to the program start voltage $V_{s2}$. After the first program voltage Vp1' is applied to the selected word line, a verify voltage Vr is applied to the selected memory cells in a verify phase of the first program loop. This is identical to the description shown in FIG. 7.

Subsequently, in a program phase of a second program loop, a second program voltage Vp2' is applied to the selected word line. A magnitude of the second program voltage Vp2' becomes a value higher by a first step voltage ΔV1 than the first program voltage Vp1'. The first step voltage ΔV1 is a value higher than the previously described step voltage ΔV. Accordingly, the second program voltage Vp2' shown in FIG. 9 becomes a value higher than the second program voltage Vp2' shown in FIG. 7.

Likewise, in a third program loop, a voltage of a third program voltage Vp3' becomes a value higher by the first step voltage ΔV1 than the second program voltage Vp2'. After the third program voltage Vp3' is applied to the selected word line, a verify voltage Vr is applied to the selected memory cells in a verify phase of the third program loop. Such a process is repeated until a fifth program loop.

In a program phase of a sixth program loop, a sixth program voltage Vp6' is applied to the selected word line. A magnitude of the sixth program voltage Vp6' becomes a value higher by a second step voltage ΔV2 than a fifth program voltage Vp5'. The second step voltage ΔV2 is a value lower than the first step voltage ΔV1.

In a subsequent program loop, a program voltage is calculated by using the second step voltage ΔV2, and a program operation is performed according to the program voltage.

That is, in accordance with the embodiment of the present disclosure, in the ISSP corresponding to the second window $V_{w2}$, a program voltage is determined by using the first step voltage $\Delta V1$ which is relatively high in some initial program loops (e.g., the first to fifth program loops), and a program voltage is determined by using the second step voltage $\Delta V2$ which is relatively low in subsequent program loops (e.g., the sixth program loop and program loops subsequent thereto).

Accordingly, in accordance with the embodiment of the present disclosure, a threshold voltage distribution of memory cells is narrowly formed by relatively rapidly increasing a program voltage in an initial program loop of a program operation and relatively slowly increasing a program voltage in a subsequent program loop. As a result, the threshold voltage distribution of the memory cells can be narrowly formed while using a relatively wide program window, without largely decreasing the program speed.

Figure 10:
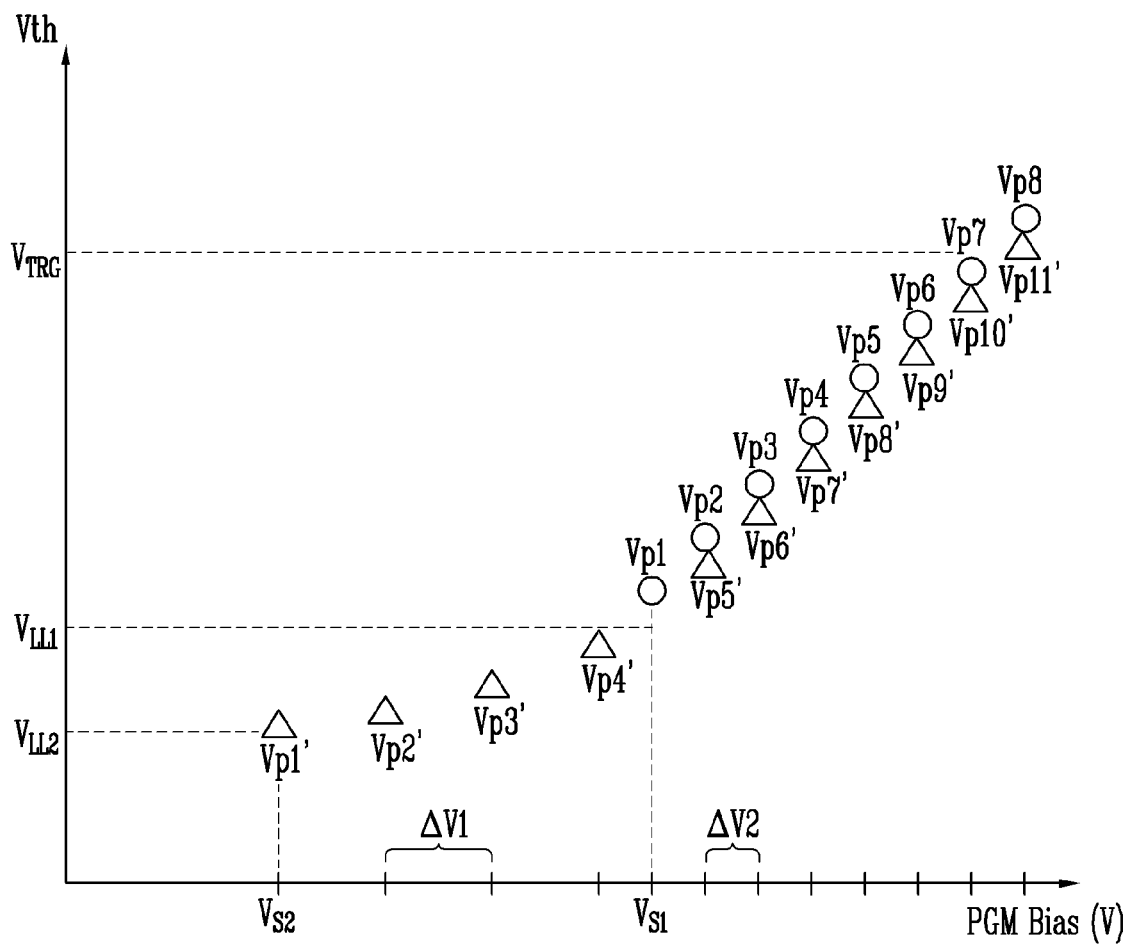
FIG. 10 is a graph illustrating program speed improvement when a step voltage is increased in a program initial phase as described with reference to FIG. 9.

FIG. 10 is, for an embodiment, a graph illustrating program speed improvement when a step voltage is increased in a program initial phase as described with reference to FIG. 9.

Similarly to FIG. 8, the horizontal axis of the graph shown in FIG. 10 represents magnitude of program voltage applied in each program loop, i.e., program bias, and the vertical axis of the graph shown in FIG. 10 represents threshold voltage Vth of a memory cells according to application of each program voltage. In FIG. 10, a change in threshold voltage of the memory cell with respect to the program voltage is indicated by a circular shape in the ISSP method corresponding to the first window $V_{w1}$, and a change in threshold voltage of the memory cell with respect to the program voltage is indicated by a triangular shape in the ISSP method corresponding to the second window $V_{w2}$.

Referring to only circular symbols shown in FIG. 10, change in threshold voltage of the memory cell during first to eighth program loops in the ISSP method corresponding to the first window $V_{w1}$ is illustrated. Positions of the circular symbols shown in FIG. 10 are equal to the positions of the circular symbols shown in FIG. 8, and therefore, overlapping descriptions will be omitted.

Meanwhile, referring to only triangular symbols shown in FIG. 8, change in threshold voltage of the memory cells during first to eleventh program loops in the ISSP method corresponding to the second window $V_{w2}$ is illustrated. A threshold voltage of the memory cell in an initial phase has a value in the vicinity of the second lower limit voltage $V_{LL2}$. The threshold voltage of the memory cells will increase as a value slightly higher than the second lower limit voltage $V_{LL2}$ as the first program voltage Vp1' is applied to the memory cell.

As shown in FIG. 10, the first program voltage Vp1' corresponds to the program start voltage $V_{s2}$ which is relatively low in the ISSP method corresponding to the second window $V_{w2}$, and program voltages Vp1' to Vp5' applied to the selected memory cells in some initial program loops, i.e., first to fifth program loops are determined based on the first step voltage $\Delta V1$ which is relatively high. Meanwhile, subsequent program loops, i.e., program voltages Vp6' to Vp11' applied to the selected memory cells in sixth to eleventh program loops are determined based on the second step voltage $\Delta V2$ which is relatively low.

Accordingly, the program voltages Vp1' to Vp5' are largely increased by using the first step voltage $\Delta V1$ which is relatively high in a voltage interval $V_{s2}$ to $V_{s1}$ in which an efficiency for moving a threshold voltage of memory cells is low, and the program voltages Vp6' to Vp11' can be finely adjusted by using the second step voltage $\Delta V2$ which is relatively low in a subsequent voltage interval.

Thus, a relatively large number of program loops can be prevented or mitigated from being performed in an initial program loop. In FIG. 10, it is illustrated that the threshold voltage of the memory cell reaches a target voltage $V_{TRG}$ through 11 program loops in the ISPP corresponding to the second window $V_{w2}$. The number of program loops shown in FIG. 10 is remarkably decreased as compared with the number of program loops shown in FIG. 8, which is 15. That is, in an embodiment, the program speed can be prevented or mitigated from being largely decreased even when a relatively wide program window is used.

Figure 11:
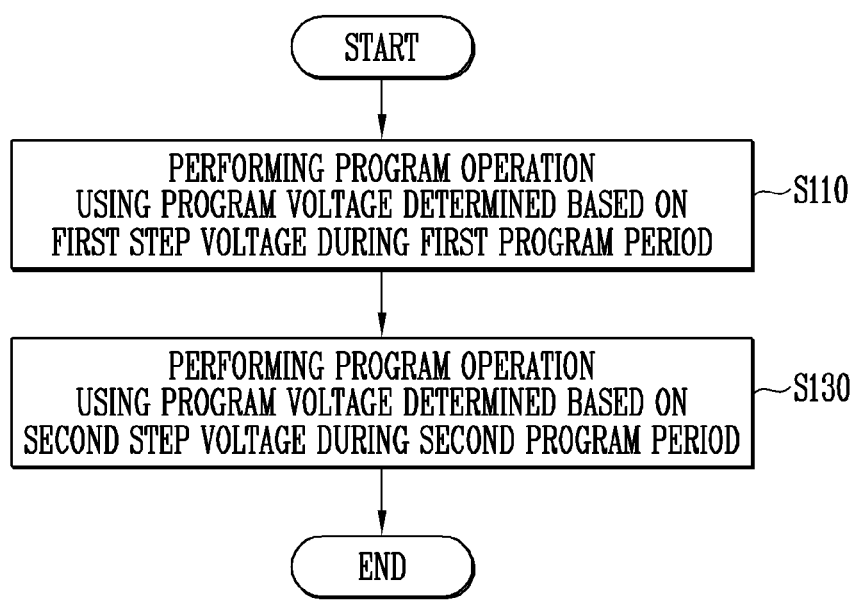
FIG. 11 is a flowchart illustrating an aspect of an operating method of the semiconductor memory device in accordance with an embodiment of the present disclosure.

FIG. 11 is a flowchart illustrating an aspect of an operating method of the semiconductor memory device in accordance with an embodiment of the present disclosure.

Referring to FIG. 11, the operating method of the semiconductor memory device in accordance with the embodiment of the present disclosure includes step S110 of performing a program operation using a program voltage determined based on a first step voltage $\Delta V1$ during a first program period and step S130 of performing a program operation using a program voltage determined based on a second step voltage $\Delta V2$ during a second program period.

In the step S110, the first program period may, for example, include first to fifth program loops. As described with reference to FIG. 9, a program voltage applied to a selected word line in the first to fifth program loops is determined based on the first step voltage $\Delta V1$.

In the step S130, the second program period may, for example, include a sixth program loop and program loops subsequent thereto. As described with reference to FIG. 9, a program voltage applied to the selected word line in the sixth program loop and the program loops subsequent thereto may be determined based on the second step voltage $\Delta V2$.

In an embodiment, the second step voltage $\Delta V2$ may be a voltage lower than the first step voltage $\Delta V1$. However, the present disclosure is not limited thereto, and the second step voltage $\Delta V2$ may be a voltage higher than the first step voltage $\Delta V1$, if necessary.

In FIGS. 9 and 10, it has been illustrated that the first program period includes the first to fifth program loops. However, this is merely illustrative, and the number of program loops included in the first program period may be variously determined in a design, if necessary. That is, the number of program loops may be determined according to the program start voltage $V_{s2}$, the magnitude of the first step voltage $\Delta V1$, and the length of a period in which an efficiency for increasing the threshold voltage is low. Meanwhile, the first step voltage $\Delta V1$ may also be variously determined in a design, if necessary.

Figure 12:
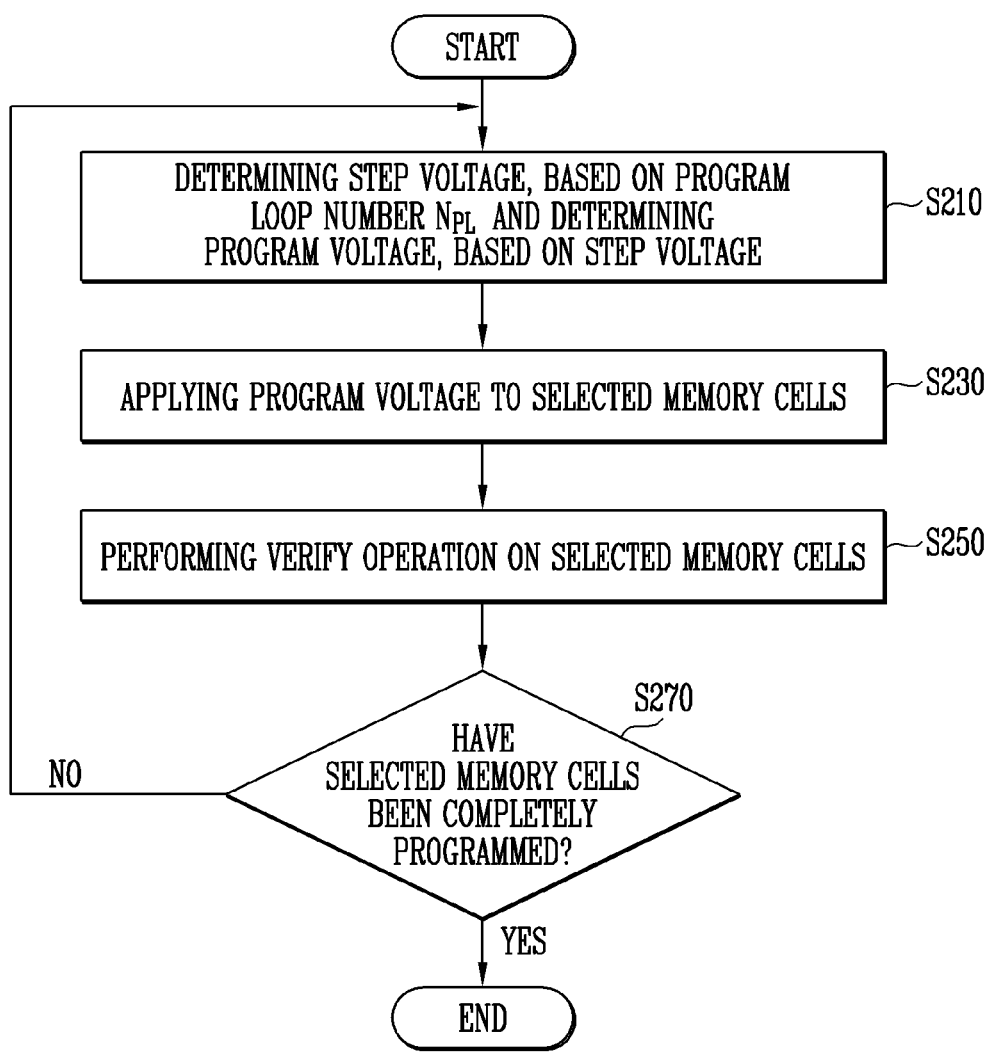
FIG. 12 is a flowchart illustrating another aspect of an operating method of the semiconductor memory device in accordance with an embodiment of the present disclosure.

FIG. 12 is a flowchart illustrating another aspect of an operating method of the semiconductor memory device in accordance with an embodiment of the present disclosure. In the flowchart shown in FIG. 11, it is illustrated that the step S110 includes at least one program loop and the step S130 also includes at least one program loop. On the other hand, steps included in the flowchart shown in FIG. 12 represent one program loop.

Referring to FIG. 12, the operating method of the semiconductor memory device in accordance with the embodiment of the present disclosure includes step S210 of determining a step voltage, based on a program loop number $N_{PL}$ and determining a program voltage, based on the step voltage, step S230 of applying the program voltage to selected memory cells, step S250 of performing a verify operation on the selected memory cells, and step S270 of determining whether the selected memory cells have been completely programmed.

In the step S210, a step voltage is determined based on a program loop number $N_{PL}$ of currently performed program loops. For example, when the currently performed program loop is a first program loop, the program loop number $N_{PL}$ becomes 1. In addition, when the currently performed program loop is a second program loop, the program loop number $N_{PL}$ becomes 2. In the step S210, a step voltage is first determined based on the current program loop number $N_{PL}$, and a program voltage is determined based on the step voltage. The program voltage in the current program loop may be determined as a value obtained by adding the step voltage to a program voltage used in a previous program loop. An example of an embodiment of the step S210 will be described later with reference to FIG. 13.

In the step S230, the program voltage is applied to selected memory cells. Specifically, in the step S230, a program allow voltage may be applied to a bit line connected to program allow cells among the selected memory cells, and a program inhibit voltage may be applied to a bit line connected to program inhibit cells. Also, in the step S230, the program voltage may be applied to a selected word line connected to the selected memory cells, and a program pass voltage may be applied to the other unselected word lines. As the step S230 is performed, a threshold voltage of the program allow cells will increase.

In step S250, a verify operation is performed on the selected memory cells. Specifically, in the step S250, a verify voltage may be applied to the selected word line, and a verify pass voltage may be applied to the unselected word lines. Through the step S250, it may be determined whether a threshold voltage of at least some memory cells among the selected memory cells is higher than the verify voltage. In the step S250, the verify operation may be performed by using only one verify voltage, and be performed by using two or more verify voltages. In addition, as a program loop is repeatedly performed, the verify voltage used in the step S250 may be changed.

In the step S270, it is determined whether the selected memory cells have been completely programmed. More specifically, in the step S270, it may be determined whether each of threshold voltages of the selected memory cells has sufficiently increased to be included in a target program state. When each of the threshold voltages of the selected memory cells sufficiently increases to be included in the target program state (S270: YES), a program operation is ended. When each of the threshold voltages of the selected memory cells does not sufficiently increase to be included in the target program state (S270: NO), the semiconductor memory device returns to the step S210 to perform a subsequent program loop.

That is, the steps S210, S230, and S250 shown in FIG. 12 constitute one program loop. After the one program loop is performed, it is determined whether the selected memory cells have been completely programmed (S270). When the selected memory cells are not completely programmed (S270: NO), a subsequent program loop is performed. When the selected memory cells are completely programmed (S270: YES), the program operation is ended.

Figure 13:
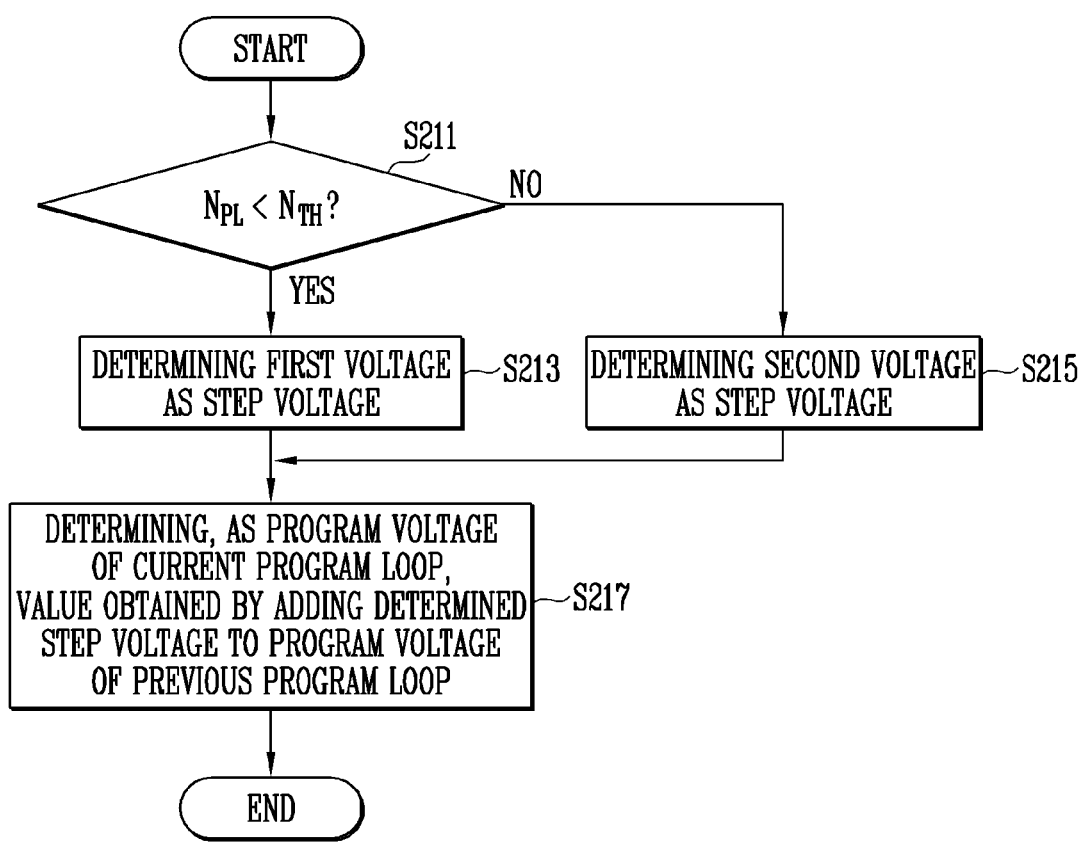
FIG. 13 is a flowchart illustrating an embodiment of step S210 shown in FIG. 12.

FIG. 13 is a flowchart illustrating an example of an embodiment of the step S210 shown in FIG. 12.

Referring to FIG. 13, the step S210 of determining the step voltage, based on the program loop number $N_{PL}$ and determining the program voltage, based on the step voltage includes step S211 of determining whether the program loop number $N_{PL}$ is smaller than a threshold loop number NTH, step S213 of determining a first voltage as the step voltage when the program loop number $N_{PL}$ is smaller than a threshold loop number NTH, and step S217 of determining, as a program voltage of a current program loop, a value obtained by adding the determined step voltage to a program voltage of a previous program loop.

In the step S211, it is determined whether a program loop number $N_{PL}$ corresponding to a current program loop is smaller than a predetermined threshold loop number NTH. In the embodiment shown in FIGS. 9 and 10, the threshold loop number NTH is 6. However, the present disclosure is not limited thereto, and the threshold loop number NTH may be variously determined, if necessary. The word "predetermined" as used herein with respect to a parameter, such as a predetermined threshold loop number or predetermined value etc., means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

When the program loop number $N_{PL}$ corresponding to the current program loop is smaller than the predetermined threshold loop number NTH (S211: YES), a first voltage is determined as the step voltage. The first voltage may be the voltage value of the first step voltage $\Delta V1$ shown in FIGS. 9 and 10. In accordance with the embodiment shown in FIGS. 9 and 10, since the threshold loop number NTH is 6, the first voltage may be determined as the step voltage during the first to fifth program loops.

Meanwhile, in accordance with an embodiment of the present disclosure, the step S210 shown in FIG. 12 may include step S215 of determining a second voltage as the step voltage when the program loop number $N_{PL}$ is not smaller than the threshold loop number NTH (S211: NO). In accordance with the embodiment shown in FIGS. 9 and 10, since the threshold loop number NTH is 6, the second voltage may be determined as the step voltage in the sixth program loop and the subsequent program loop. The second voltage may be the voltage value of the second step voltage $\Delta V2$ shown in FIGS. 9 and 10.

In an embodiment, the second voltage may be a value lower than the first voltage. However, the present disclosure is not limited thereto, and the second voltage may be a value higher than the first voltage.

In the step S217, a program voltage to be used in the current program loop is determined. Specifically, a value obtained by adding the step voltage determined in the step S213 to a program voltage used in a previous program loop may be determined as the program voltage of the current program loop. In accordance with the embodiment shown in FIGS. 9 and 10, since the threshold loop number NTH is 6, the program voltage of the current program loop may be determined by adding the first voltage to the program voltage of the previous program loop during the first to fifth program loops. In addition, the program voltage of the current program loop may be determined by adding the second voltage to the program voltage of the previous program loop in the sixth program loop and the subsequent program loop.

As described with reference to FIGS. 9 to 13, it has been described that the first step voltage $\Delta V1$ used in the first program period, i.e., initial program loops of the program operation is determined as a predetermined value, if necessary. However, it is necessary to change the first step voltage ΔV1 while the semiconductor memory device 100 is used. The first step voltage ΔV1 is adaptively determined according to a program speed of memory cells in an actual initial program loop, thereby optimizing the program operation of the semiconductor memory device. Hereinafter, this will be described with reference to FIGS. 14 to 17.

Figure 14:
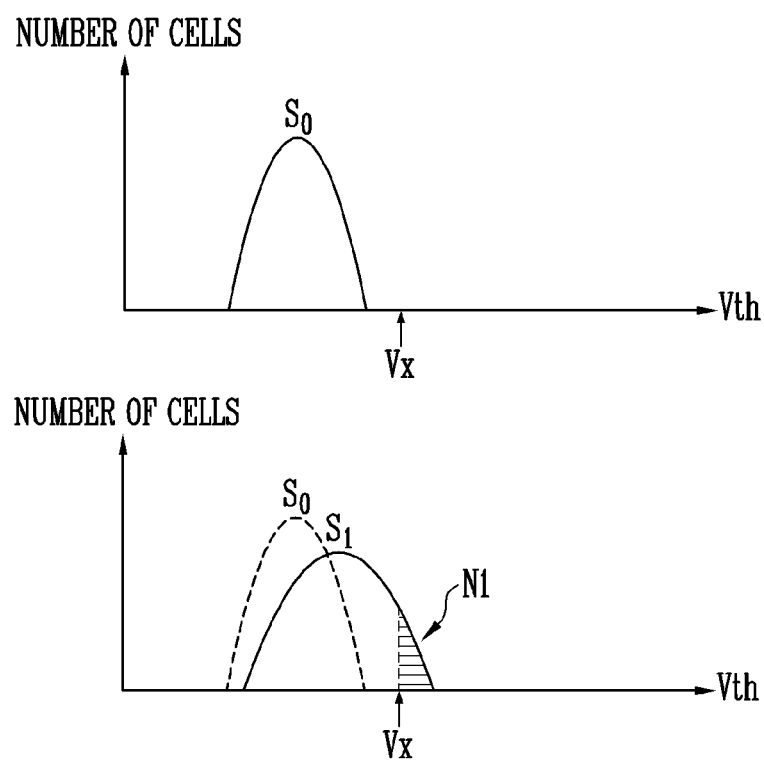
FIG. 14 is a diagram illustrating a method of determining a first voltage specified in step S213 shown in FIG. 13 in accordance with an embodiment of the present disclosure.

FIG. 14 is a diagram illustrating a method of determining the first voltage specified in step S213 shown in FIG. 13 in accordance with an embodiment of the present disclosure.

In accordance with an embodiment of the present disclosure, in order to determine the first voltage, a program speed of memory cells may be checked in the first program loop of the program operation. To this end, a reference voltage Vx may be used. In an upper graph shown in FIG. 14, an initial threshold voltage distribution $S_0$ of the selected memory cells before the program operation is performed is illustrated. The initial threshold voltage distribution $S_0$ corresponds to the erase state.

In the first program loop, the program start voltage $V_{s2}$ may be applied as the first program voltage Vp1' to the selected word line. Accordingly, the threshold voltage of the program allow memory cells among the selected memory cells increases. Therefore, the initial threshold voltage distribution $S_0$ may be changed to a first distribution $S_1$.

Referring to a lower graph shown in FIG. 14, as the threshold voltage distribution of the memory cells is changed to the first distribution $S_1$, memory cells having threshold voltages higher than the reference voltage Vx appears. Specifically, in the lower graph shown in FIG. 14, the memory cells having the threshold voltages higher than the reference voltage Vx are memory cells corresponding to a hatched area in the first distribution $S_1$. The program speed of the memory cells may be determined according to a number N1 of memory cells having threshold voltages higher than the reference voltage Vx among memory cell belonging to the first distribution $S_1$.

For example, when the number N1 of memory cells having threshold voltages greater than the reference voltage Vx is a relatively small value, it may be determined that the program speed of the memory cells is slow. The first step voltage ΔV1 used in the first program period, i.e., initial program loops of the program operation may be determined as a relatively high value.

On the contrary, when the number N1 of memory cells having threshold voltages greater than the reference voltage Vx is a relatively high value, it may be determined that the program speed of the memory cells is fast. The first step voltage ΔV1 used in the first program period, i.e., initial program loops of the program operation may be determined as a relatively low value.

A process of calculating the number N1 of memory cells having threshold voltages higher than the reference voltage Vx may be performed in a manner similar to a manner of the verify operation. That is, the reference voltage Vx is applied to the selected word line, and the verify pass voltage is applied to the unselected word line. Bit data representing whether the threshold voltage of the memory cells is higher than the reference voltage Vx may be stored in latches of the page buffers PB1 to PBn corresponding to the respective memory cells. Meanwhile, a Current Sensing Circuit (CSC) widely used in the verify operation may generate a current corresponding to the number N1 of memory cells having threshold voltages higher than the reference voltage Vx, based on the bit data of the latches. The configuration and operating method of the current sensing circuit is widely known in the art to which the present disclosure pertains, and therefore, its detailed descriptions will be omitted.

Additionally, the generated current is converted into a digital value through an analog-digital converter, so that the number N1 of memory cells having threshold voltages higher than the reference voltage Vx can be calculated.

The semiconductor memory device 100 may store a lookup table for determining a corresponding first step voltage ΔV1 according to a range of the number N1 of memory cells having threshold voltages higher than the reference voltage Vx. For example, the lookup table may be configured as shown in the following Table 1.

TABLE 1

| Range of N1 | ΔV1 |
| --- | --- |
| 0 ≤ N1 < x1 | Vx1 |
| x1 ≤ N1 < x2 | Vx2 |
| x2 ≤ N1 < x3 | Vx3 |
| . . . | . . . |
| X(n − 1) ≤ N1 < xn | Vxn |

As shown in the above Table 1, the first step voltage ΔV1 may be determined by the lookup table representing voltage values Vx1 to Vxn respectively corresponding to a plurality of ranges of the number N1 of memory cells having threshold voltages higher than the reference voltage Vx. In an embodiment, the process of determining the first step voltage ΔV1 may be performed in the initial first program loop, and a program voltage may be determined by using the determined first step voltage ΔV1 in subsequent program loops.

In FIG. 14, it is illustrated that the reference voltage Vx is a voltage higher than a threshold voltage higher than threshold voltages of all memory cells belonging to the initial threshold voltage distribution $S_0$. However, this is merely illustrative, and the present disclosure is not limited thereto. For example, the reference voltage Vx may be a value which is higher than threshold voltages of some memory cells among the memory cells belonging to the initial threshold voltage distribution $S_0$ and is lower than threshold voltages of the other memory cells.

Figure 15:
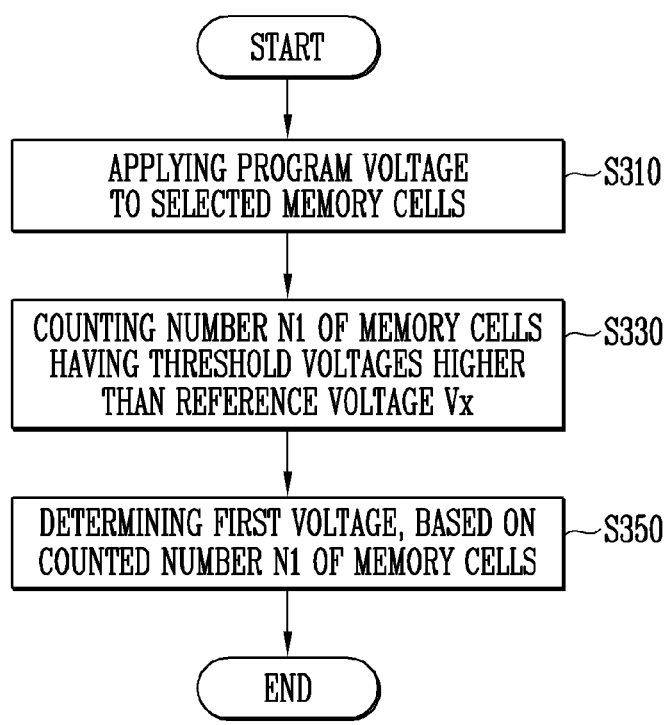
FIG. 15 is a flowchart illustrating an embodiment of determining the first voltage specified in the step S213 shown in FIG. 13 in accordance with an embodiment of the present disclosure.

FIG. 15 is a flowchart illustrating an embodiment of determining the first voltage specified in the step S213 shown in FIG. 13 in accordance with an embodiment of the present disclosure. Specifically, FIG. 15 is a flowchart illustrating in detail the method described with reference to FIG. 14, and illustrates phases included in the first program loop.

Referring to FIG. 15, the method of determining the first voltage in the first program loop includes step S310 of applying a program voltage to selected memory cells, step S330 of counting a number N1 of memory cells having threshold voltages higher than the reference voltage Vx, and step S350 of determining a first voltage, based on the counted number N1 of memory cells.

In the step S310, a program voltage Vp1' is applied to a word line connected to selected memory cells corresponding to the initial threshold voltage distribution $S_0$. Accordingly, a threshold voltage distribution of the selected memory cells will be changed from the initial threshold voltage distribution $S_0$ to the first distribution $S_1$.

In the step S330, a number N1 of memory cells having threshold voltages higher than the reference voltage Vx is counted. As described above, in the step S330, a process of counting the number N1 of memory cells having threshold voltages higher than the reference voltage Vx may be performed in a manner similar to a manner of the verify operation. That is, the reference voltage Vx is applied to the selected word line, and the verify pass voltage is applied to the unselected word line. Bit data representing whether the threshold voltage of the memory cells is higher than the reference voltage Vx may be stored in latches of the page buffers PB1 to PBn corresponding to the respective memory cells. Meanwhile, a Current Sensing Circuit (CSC) used in the verify operation may generate a current corresponding to the number N1 of memory cells having threshold voltages higher than the reference voltage Vx, based on the bit data of the latches. Additionally, the generated current is converted into a digital value through an analog-digital converter, so that the number N1 of memory cells having threshold voltages higher than the reference voltage Vx can be calculated.

In the step S350, a first voltage may be determined based on the number N1 of memory cells having threshold voltages higher than the reference voltage Vx. The first voltage may be determined with reference to a lookup table such as the above-described Table 1.

Referring to FIGS. 14 and 15, the first voltage may be determined in the initial first program loop, and be used as a fixed value in a subsequent first program period, e.g., the second to fifth program loops. However, the present disclosure is not limited thereto, and a first voltage may be determined for each of a plurality of program loops belonging to the first program period. Hereinafter, this will be described with reference to FIGS. 16 and 17.

Figure 16:
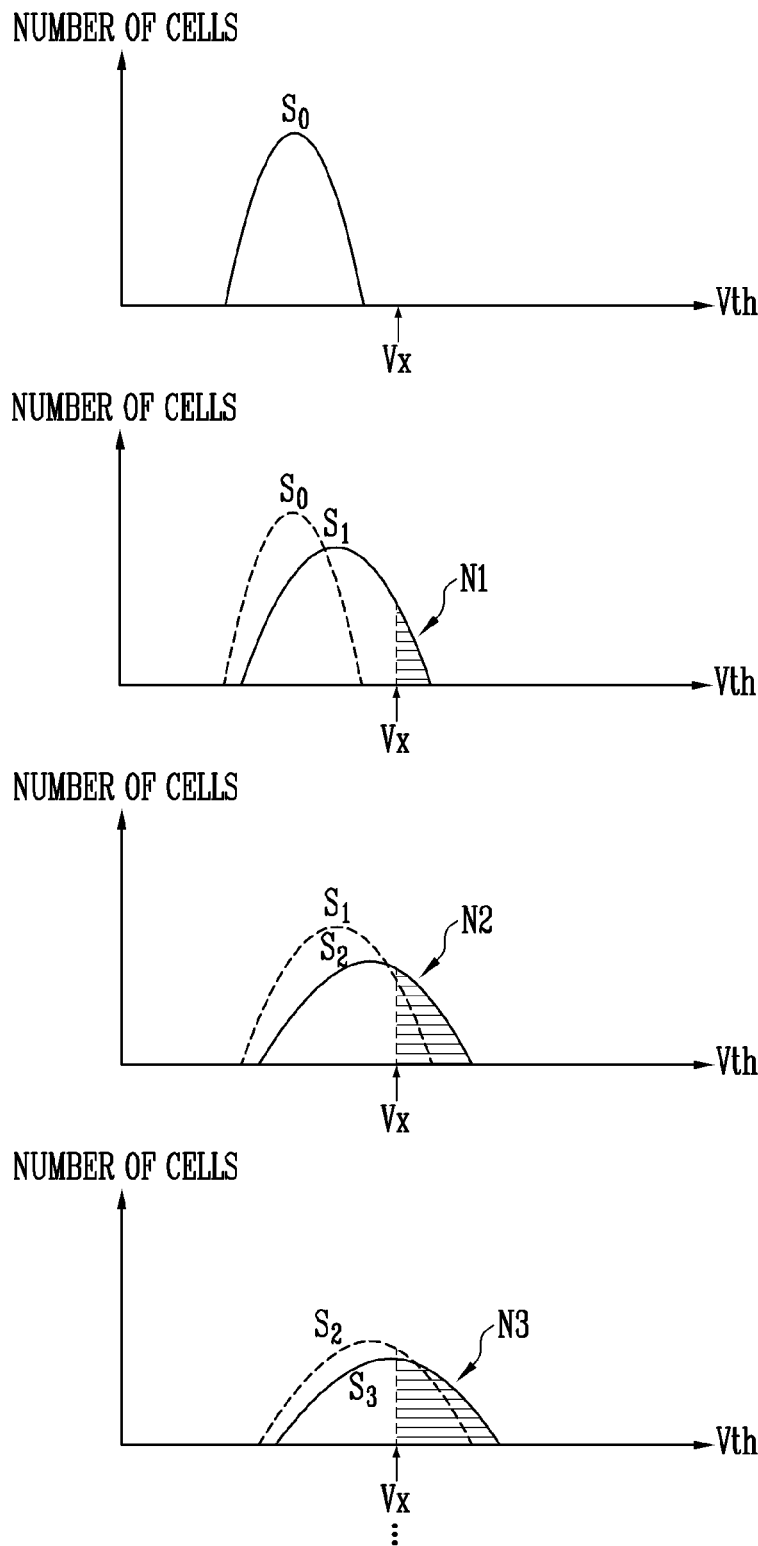
FIG. 16 is a diagram illustrating a method of determining a step voltage in the step S213 shown in FIG. 13.

FIG. 16 is a diagram illustrating a method of determining the step voltage in the step S213 shown in FIG. 13.

In accordance with an embodiment of the present disclosure, in order to determine the first voltage, a program speed of memory cells may be checked in each program loop within the first program loop (e.g., the first to fifth program loops). To this end, a reference voltage Vx may be used. In a first graph shown in FIG. 16, an initial threshold voltage distribution $S_0$ of the selected memory cells before the program operation is performed is illustrated. The initial threshold voltage distribution $S_0$ corresponds to the erase state.

In the first program loop, the program start voltage $V_{s2}$ may be applied as the first program voltage Vp1' to the selected word line. Accordingly, the threshold voltage of the program allow memory cells among the selected memory cells increases. Therefore, the initial threshold voltage distribution $S_0$ may be changed to a first distribution $S_1$.

Referring to a second graph shown in FIG. 16, as the threshold voltage distribution of the memory cells is changed to the first distribution $S_1$, memory cells having threshold voltages higher than the reference voltage Vx appears. Specifically, in the second graph shown in FIG. 16, a first voltage to be used in the second program loop may be determined according to a number N1 of memory cells having threshold voltages higher than the reference voltage Vx. A second program voltage Vp2' to be used in the second program loop is determined based on the determined first voltage. In the second program loop, the determined second program voltage Vp2' may be applied to the selected word line. Accordingly, the threshold voltage of the program allow memory cells among the selected memory cells increases. Therefore, the first distribution $S_1$ may be changed to a second distribution $S_2$.

Referring to a third graph shown in FIG. 16, as the threshold voltage distribution of the memory cells is changed to the second distribution $S_2$, the number of memory cells having threshold voltages higher than the reference voltage Vx increases. Specifically, in the third graph shown in FIG. 16, a first voltage to be used in the third program loop may be determined according to a number N2 of memory cells having threshold voltages higher than the reference voltage Vx. A third program voltage Vp3' to be used in the third program loop is determined based on the determined first voltage. In the third program loop, the determined third program voltage Vp3' may be applied to the selected word line. Accordingly, the threshold voltage of the program allow memory cells among the selected memory cells increases. Therefore, the second distribution $S_2$ may be changed to a third distribution $S_3$.

Referring to a fourth graph shown in FIG. 16, as the threshold voltage distribution of the memory cells is changed to the third distribution $S_3$, the number of memory cells having threshold voltages higher than the reference voltage Vx again increases. Specifically, in the fourth graph shown in FIG. 16, a first voltage to be used in the fourth program loop may be determined according to a number N3 of memory cells having threshold voltages higher than the reference voltage Vx. A fourth program voltage Vp4' to be used in the fourth program loop is determined based on the determined first voltage.

In this manner, a first voltage used to determine a program voltage in each program loop may be determined based on a result Nx obtained by counting a number of memory cells having threshold voltages higher than the reference voltage Vx for each program loop.

Figure 17:
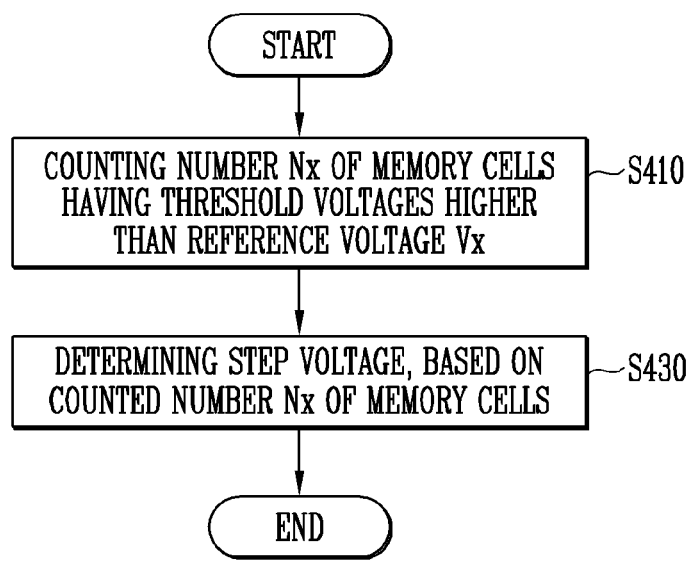
FIG. 17 is a flowchart illustrating an embodiment of determining the step voltage in the step S213 shown in FIG. 13.

FIG. 17 is a flowchart illustrating an example of an embodiment of determining the step voltage in the step S213 shown in FIG. 13.

Referring to FIG. 17, the step S213 shown in FIG. 13 includes step S410 of counting a number Nx of memory cells having threshold voltages higher than the reference voltage Vx and step S430 of determining a step voltage, based on the counted number Nx of memory cells. The steps S410 and S430 shown in FIG. 17 may be included in the step S213 shown in FIG. 13. That is, the steps S410 and S430 shown in FIG. 17 are repeatedly performed for each program loop. Therefore, a step voltage may be determined by counting a number Nx of memory cells having threshold voltages higher than the reference voltage Vx for each program loop of the first program period.

Referring to FIG. 16, it has been illustrated that the reference voltage Vx is a fixed value even when a program loop is repeated. However, the present disclosure is not limited thereto, and the reference voltage Vx having different values may be used whenever the program loop is repeated.

Figure 18:
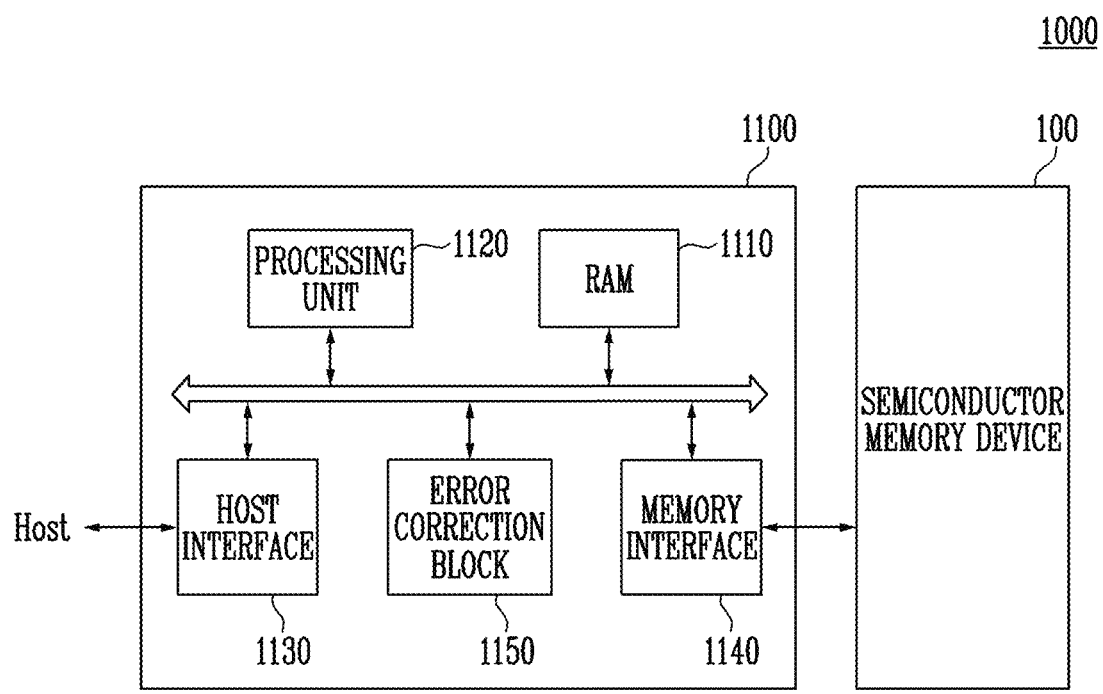
FIG. 18 is a block diagram illustrating a memory system including the semiconductor memory device shown in FIG. 1.

FIG. 18 is a block diagram illustrating a memory system including the semiconductor memory device shown in FIG. 1.

Referring to FIG. 18, the memory system 1000 includes a semiconductor memory device 100 and a controller 1100. The semiconductor memory device 100 may be the semiconductor memory device described with reference to FIG. 1. Hereinafter, overlapping descriptions will be omitted.

The controller 1100 is coupled to a host Host and the semiconductor memory device 100. The controller 1100 accesses the semiconductor memory device 100 in response to a request from the host Host. For example, the controller 1100 controls read, write, erase, and background operations of the semiconductor memory device 100. The controller 1100 provides an interface between the semiconductor memory device 100 and the host Host. The controller 1100 drives firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one of a working memory of the processing unit 1120, a cache memory between the semiconductor memory device 100 and the host Host, and a buffer memory between the semiconductor memory device 100 and the host Host. The processing unit 1120 controls overall operations of the controller 1100. In addition, the controller 1100 may temporarily store program data provided from the host Host in a write operation.

The host interface 1130 includes a protocol for exchanging data between the host Host and the controller 1100. In an example of an embodiment, the controller 1100 communicates with the host Host through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer System Interface (SCSI) protocol, an Enhanced Small Disk Interface (ESDI) protocol, an Integrated Drive Electronics (IDE) protocol, and a private protocol.

The memory interface 1140 interfaces with the semiconductor memory device 100. For example, the memory interface 1140 may include a NAND interface or a NOR interface.

The error correction block 1150 detects and corrects an error of data received from the semiconductor memory device 100 by using an error correction code (ECC). The processing unit 1120 may adjust a read voltage, based on an error detection result of the error correction block 1150, and control the memory device 100 to perform re-reading. In an example of an embodiment, the error correction block 1150 may be provided as a component of the controller 1100.

The controller 1100 and the semiconductor memory device 100 may be integrated into one semiconductor device. In an example of an embodiment, the controller 1100 and the semiconductor memory device 100 may be integrated into one semiconductor device, to constitute a memory card. For example, the controller 1100 and the semiconductor memory device 100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 1100 and the semiconductor memory device 100 may be integrated into one semiconductor device to constitute a semiconductor drive (solid state drive (SSD)). The semiconductor drive SSD includes a storage device configured to store data in a semiconductor memory. If the memory system 1000 is used as the semiconductor drive SSD, the operating speed of the host Host coupled to the memory system 1000 can be remarkably improved.

As another example, the memory system 1000 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an example of an embodiment, the semiconductor memory device 100 or the memory system 1000 may be packaged in various forms. For example, the semiconductor memory device 100 or the memory system 1000 may be packaged in a manner such as Package On Package (POP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 19:
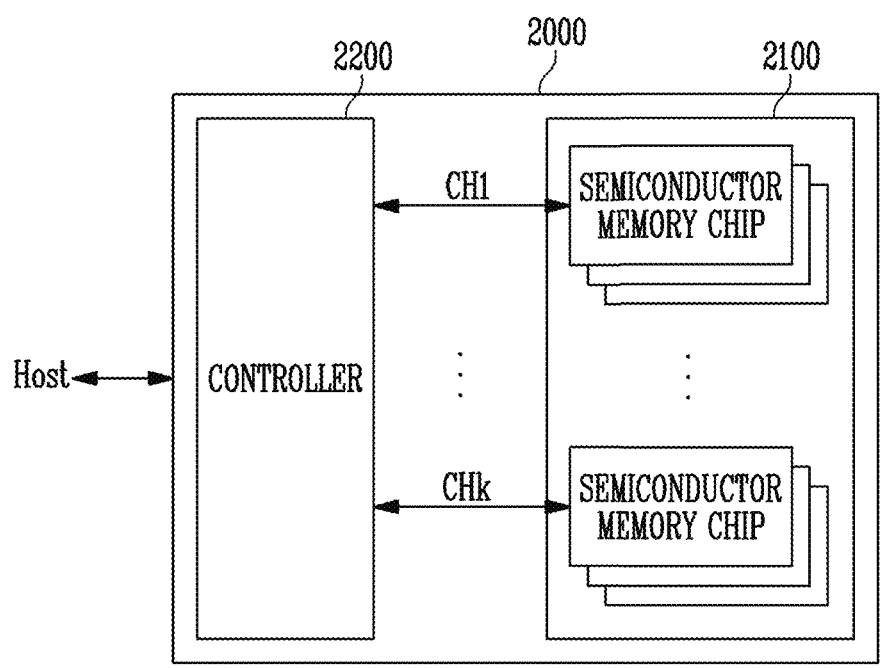
FIG. 19 is a block diagram illustrating an application example of the memory system shown in FIG. 18.

FIG. 19 is a block diagram illustrating an application example of the memory system shown in FIG. 18.

Referring to FIG. 19, the memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 19, it is illustrated that the plurality of groups communicate with the controller 2200 respectively through first to kth channels CH1 to CHk. Each semiconductor memory chip may be configured and operated identically to the semiconductor memory device 100 described with reference to FIG. 1.

Each group communicates with the controller 2200 through one common channel. The controller 2200 is configured identically to the controller 1100 described with reference to FIG. 18. The controller 2200 controls the plurality of memory chips of the semiconductor memory device 2100 through the plurality of channels CH1 to CHk.

Figure 20:
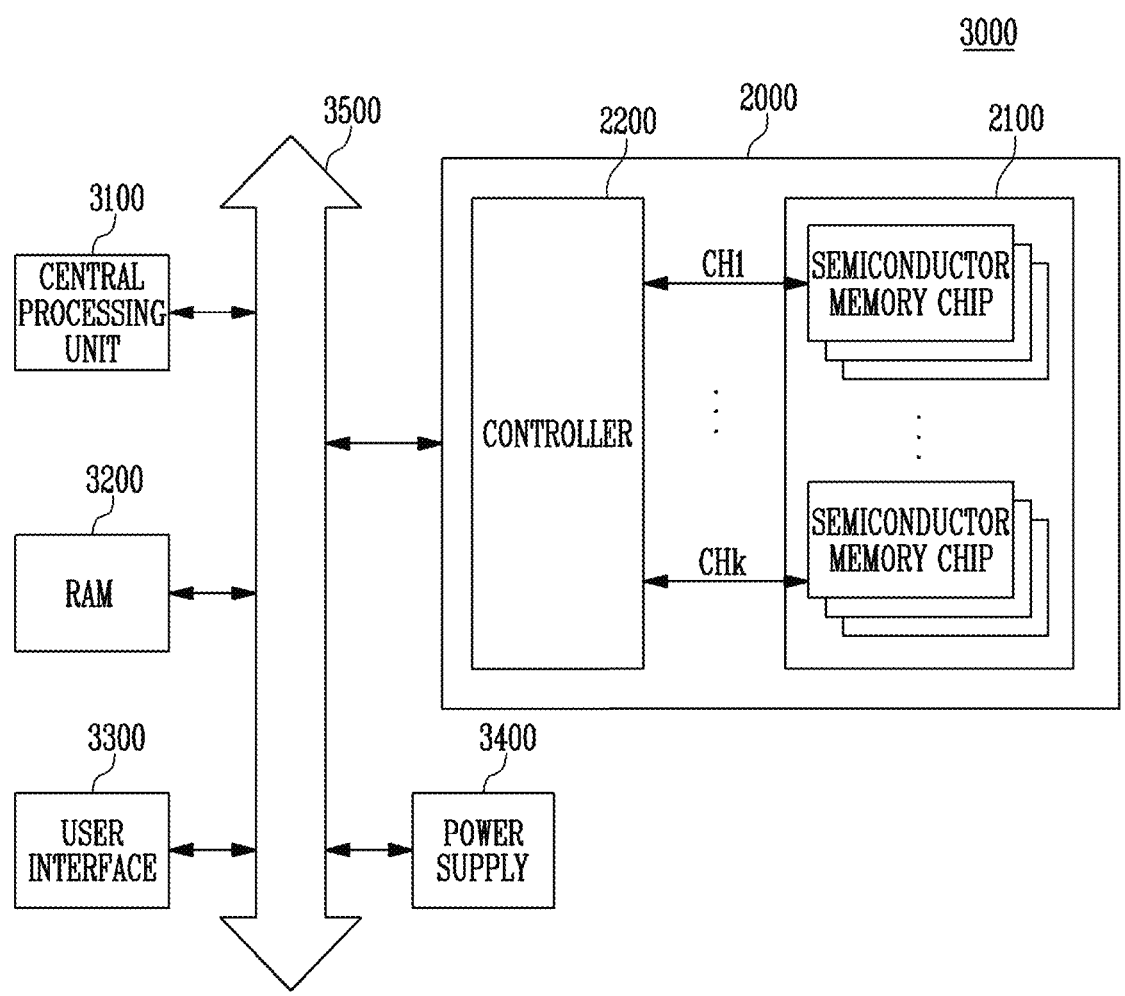
FIG. 20 is a block diagram illustrating a computing system including the memory system described with reference to FIG. 19.

FIG. 20 is a block diagram illustrating a computing system including the memory system described with reference to FIG. 19.

Referring to FIG. 20, the computing system 3000 includes a central processing unit 3100, a RAM 3200, a user interface 3300, a power supply 3400, a system bus 3500, and a memory system 2000.

The memory system 2000 is electrically coupled to the central processing unit 3100, the RAM 3200, the user interface 3300, and the power supply 3400 through the system bus 3500. Data supplied through user interface 3300 or data processed by the central processing unit 3100 are stored in the memory system 2000.

In FIG. 20, there is illustrated a case where the semiconductor memory device 2100 is coupled to the system bus 3500 through the controller 2200. However, the semiconductor memory device 2100 may be directly coupled to the system bus 3500. The function of the controller 2200 may be performed by the central processing unit 3100 and the RAM 3200.

In FIG. 20, there is illustrated a case where the memory system 2000 described with reference to FIG. 19 is provided. However, the memory system 2000 may be replaced by the memory system 1000 described with reference to FIG. 18. In an example of an embodiment, the computing system 3000 may include both of the memory systems 1000 and 2000 described with reference to FIGS. 18 and 19.

In accordance with the present disclosure, in an embodiment, there can be provided a semiconductor memory device having an improved program speed and an operating method of the semiconductor memory device.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A method of operating a semiconductor memory device, which comprises a plurality of program loops,
   wherein at least some program loops among the plurality of program loops include:
   determining a step voltage based on a comparison result of a threshold loop number and a current program loop number;
   determining a program voltage based on the step voltage;
   applying the program voltage to selected memory cells; and
   performing a verify operation on the selected memory cells, and
   wherein the determining of the step voltage includes determining the threshold loop number based on an initial program voltage applied in a first program loop among the plurality of program loops.

2. The method of claim 1, wherein the determining of the step voltage further includes determining a first voltage as the step voltage, when the current program loop number is less than the threshold loop number, and
   wherein the determining of the program voltage includes determining, as the program voltage of a current program loop, a value obtained by adding the step voltage to a previous program voltage of a previous program loop.

3. The method of claim 2, wherein the determining of the step voltage further includes determining, as the step voltage, a second voltage different from the first voltage, when the current program loop number is not less than the threshold loop number.

4. The method of claim 3, wherein the second voltage is lower than the first voltage.

5. The method of claim 2, wherein the first program loop includes:
   applying the initial program voltage to the selected memory cells;
   counting a number of memory cells having threshold voltages greater than a reference voltage; and
   determining the first voltage, based on the number of memory cells having the threshold voltages greater than the reference voltage.

6. The method of claim 1, wherein the determining of the step voltage further includes:
   counting a number of memory cells having threshold voltages greater than a reference voltage, when the current program loop number is less than the threshold loop number; and
   determining the step voltage, based on the number of memory cells having the threshold voltages greater than the reference voltage, and
   wherein the determining of the program voltage includes determining, as the program voltage of a current program loop, a value obtained by adding the step voltage to a previous program voltage of a previous program loop.

7. A semiconductor memory device comprising:
   a memory cell array including a plurality of memory cells;
   a peripheral circuit configured to perform a program operation on selected memory cells among the plurality of memory cells; and
   control logic configured to control the program operation of the peripheral circuit,
   wherein the control logic:
   controls the peripheral circuit to perform the program operation on the selected memory cells by using a first program voltage determined based on a first step voltage during a first program period; and
   controls the peripheral circuit to perform the program operation on the selected memory cells by using a second program voltage determined based on a second step voltage different from the first step voltage during a second program period after the first program period,
   wherein the first program period includes first to kth program loops, and the second program period includes a (k+1)th program loop and program loops subsequent thereto,
   wherein k is a natural number of 2 or more, and
   wherein the control logic determines k based on a program start voltage applied in the first program loop.

8. The semiconductor memory device of claim 7, wherein the first step voltage is greater than the second step voltage.

9. The semiconductor memory device of claim 7, wherein the control logic determines the first step voltage, based on a number of memory cells having threshold voltages greater than a reference voltage, as a result obtained by performing the first program loop.

10. The semiconductor memory device of claim 9, wherein the control logic changes the first step voltage, based on a number of memory cells having threshold voltages greater than the reference voltage, as a result obtained by performing the second program loop after the first program loop.

11. The semiconductor memory device of claim 9, wherein the semiconductor memory device uses a lookup table for determining a first step voltage value corresponding to the number of memory cells having the threshold voltages greater than the reference voltage.

\* \* \* \* \*